US008901980B1

(12) United States Patent
Naish et al.

(10) Patent No.: US 8,901,980 B1
(45) Date of Patent: Dec. 2, 2014

(54) DYNAMIC HYSTERESIS COMPARATOR

(71) Applicant: Dialog Semiconductor GmbH, Kirchheim/Teck-Nabern (DE)

(72) Inventors: Paul Naish, Kirchheim/Teck-Nabern (GB); Mark Childs, Swindon (GB)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 0 days.

(21) Appl. No.: 14/180,739

(22) Filed: Feb. 14, 2014

Related U.S. Application Data

(60) Provisional application No. 61/898,715, filed on Nov. 1, 2013.

(51) Int. Cl.
*H03K 3/00* (2006.01)

(52) U.S. Cl.
USPC .............. 327/206; 327/65; 327/205; 327/207

(58) Field of Classification Search
USPC ........... 327/52, 53, 58, 60, 62, 63, 65–69, 71, 327/72, 74, 77–81, 88, 89, 96, 127, 205, 327/206, 246, 266, 274, 280, 287, 359, 327/560–563
See application file for complete search history.

(56) References Cited

U.S. PATENT DOCUMENTS

| | | | | |
|---|---|---|---|---|
| 5,801,553 | A * | 9/1998 | Danstrom | 327/67 |
| 5,804,994 | A * | 9/1998 | Marlow et al. | 327/67 |
| 5,995,011 | A * | 11/1999 | Kurihara et al. | 340/663 |
| 6,208,187 | B1 | 3/2001 | Callahan, Jr. | |
| 6,304,088 | B1 | 10/2001 | Yee | |
| 6,624,668 | B1 * | 9/2003 | Robinson et al. | 327/103 |
| 7,279,951 | B2 * | 10/2007 | Ono | 327/307 |
| 7,382,167 | B1 * | 6/2008 | Umminger et al. | 327/76 |
| 7,832,167 | B2 * | 11/2010 | Salerno | 52/455 |
| 8,198,920 | B2 | 6/2012 | Chatal | |
| 8,310,279 | B2 * | 11/2012 | Sudjian | 327/65 |
| 8,786,317 | B2 * | 7/2014 | Terada et al. | 327/77 |
| 2003/0164720 | A1 * | 9/2003 | Self | 327/77 |
| 2008/0136460 | A1 | 6/2008 | Fujiwara et al. | |
| 2013/0127430 | A1 * | 5/2013 | Leung | 323/282 |

OTHER PUBLICATIONS

"A Programmable Dual Hysteretic Window Comparator," by Hong-Wei Huang et al., IEEE, 978-1-4244-1684-4/08, May 2008, pp. 1930-1933.

(Continued)

*Primary Examiner* — Brandon S Cole
(74) *Attorney, Agent, or Firm* — Saile Ackerman LLC; Stephen B. Ackerman; Billy Knowles

(57) ABSTRACT

A dynamic hysteresis comparator has a threshold voltage level with dynamic hysteresis for sensing small changes in differential input signals at the input, while controlling a duration that an output voltage state will remain fixed for preventing the output of the comparator from changing state in an unstable fashion or "chattering". The comparator has a dynamic hysteresis circuit connected to an output of a trigger circuit of the comparator that detects when a decision is made that a first input of the comparator is greater than or lesser than a second input of the comparator causing an output of the comparator to change state. Once the decision causing the change of state of the output is detected, any decisions determining that second input is now lesser than or greater than the first input are prevented from causing the output of the comparator from changing state for a fixed time period.

56 Claims, 12 Drawing Sheets

(56) References Cited

OTHER PUBLICATIONS

"Average Inductor Current Sensor for Digitally Controlled Switched-Mode Power Supplies," by Miguel Rodriguez et al., IEEE Transactions on Power Electronics, vol. 27, No. 8, Aug. 2012, pp. 3795-3806.

The Analysis of Balanced, Linear Differential Circuits, by S. A. Witherspoon et al., IEEE Transactions on Education, vol. 38, No. 1, Feb. 1995, pp. 40-50.

* cited by examiner

DYNAMIC HYSTERESIS COMPARATOR

This application claims benefit under 35 U.S.C. §119 to U.S. Provisional Patent Application Ser. No. 61/898,715, filed on Nov. 1, 2013, which is assigned to a common assignee, and is herein incorporated by reference in its entirety.

TECHNICAL FIELD

This disclosure relates generally to electronic circuits and in particular, to comparator circuits that utilizes a differential amplifier and have dynamic hysteresis where a difference decision is delayed by a fixed time period.

BACKGROUND

As is known in the art, a comparator circuit is a device that compares two input signals (either voltage or current) and provides an output digital signal that indicates which of the input signals is larger. FIGS. 1a-1c illustrate a comparator without hysteresis. FIGS. 1d-1h illustrate the structure and operation of a comparator with hysteresis. Generally, a comparator COMP 1 as shown in FIG. 1a has two input terminals Vin and Vth that are applied to a differential amplifier within the comparator COMP1. The voltage at the terminal Vth is the threshold voltage for determining whether the voltage at the input terminal Vin is lesser or greater than the threshold voltage level. When the voltage at the input terminal Vin transitions through the voltage level of the voltage at the terminal Vth, an output terminal Vo has a voltage representing the sign of the difference between the voltages applied to the two input terminals Vin and Vth. The input voltages must be each greater than the offset voltage of the differential amplifier plus an overdrive voltage such that the gain of the differential amplifier causes the voltage at the output terminal Vo to assume a voltage level defining a digital logic state $V_{OH}$ and $V_{OL}$. FIG. 1b is a plot of the voltage at the input terminal Vin versus the voltage at the output terminal Vout. FIG. 1c is a plot of the voltage at the input terminal Vin and the voltage at the output terminal Vout versus time. If the voltage level at the input terminal Vin is relatively slow in its transition, any noise present at the input terminals Vin and Vth may cause multiple transitions of the voltage level at the output terminal between the digital states. In many applications, these multiple transitions may cause damage to devices being controlled such as motors, switches, etc.

A solution to prevent multiple transitions of the comparator COMP1 is circuit is the addition of hysteresis to the comparator COMP1. Hysteresis introduces two separate threshold voltage levels to the comparator COMP1. FIGS. 1e and 1g are a schematic for a comparator with hysteresis. In FIGS. 1e and 1g, a voltage divider is added from the positive terminal +. The voltage divider is formed of the resistors R1 and R2. FIGS. 1e and 1h are plots of the input voltage Vin versus the output Vo of the comparator COMP1 for the comparators of the FIGS. 1d and 1g. In FIG. 1g, a first terminal of the resistor R1 is connected to receive the threshold voltage level Vth. A second terminal of the resistor R1 is connected to the first terminal of the resistor R2 and to the positive terminal of the comparator COMP1. The second terminal of the resistor R2 is connected to the output terminal of the comparator COMP1. In FIG. 1e, the output voltage terminal Vo is at the high output voltage level, when the input terminal Vin is at a voltage level less than the high threshold voltage level VthH when the input voltage level is transitioning from a lower voltage level to a higher voltage level. When the input voltage level passes the higher threshold voltage level VthH, the output voltage level is forced to the lower voltage VoL. When the input voltage level is greater than the lower threshold voltage level VthL, the output voltage is at the lower output voltage level VoL. When the input voltage is transitioning from a voltage greater than the lower threshold voltage level VthL to a voltage level less than the lower threshold voltage level VthL, the output voltage level is forced to the higher output voltage level VoH at the input voltage level reaching the lower threshold voltage level VthL. If there is noise on the negative(−) input voltage terminal Vin or the positive (+) input voltage terminal, the comparator will not have returned to the lower threshold level VthL, if the noise is not greater than the higher threshold voltage level VthH.

FIGS. 1g and 1h have the input voltage Vin and the threshold voltage Vth exchanged. In that case, as shown in FIG. 1h, the directions for the transitions of the input voltage level Vin to the positive (+) terminal of the comparator COMP1 versus the threshold voltage levels VthL and VthH are reversed from those of FIG. 1e. Similarly, the output voltages VoL and VoH versus the input voltage Vin are reversed.

The comparators COMP1 illustrate two types of hysteresis, where classically hysteresis is by changing the threshold voltage levels VthL and VthH dependent on the state of the output voltage levels VoL and VoH. Most means of doing this in the prior art comparators add at least 5 mV to the switching threshold voltage levels VthL and VthH.

In the prior art, other ways to achieve dynamic hysteresis often act on the inputs themselves by pulling the input threshold voltage levels VthL and VthH apart once the output changed state.

An application for a comparator is in a buck DC-to-DC converter. The comparator compares the output voltage of the buck DC-to-DC converter with a reference voltage and determines if additional current needs to be applied to an inductor in the circuit as is known in the art. The switching frequency of the current to the inductor or from the inductor are generally fixed with the duty cycle of the switching frequency being adjusted or pulse width modulated to determine the amount of current flowing into the inductor and thus to the load circuit connected the output terminal of the DC-to-DC converter.

Generally, buck DC-to-DC converters operate in one of two different modes, a continuous mode and a discontinuous mode. When the buck DC-to-DC converter is operating at light load (a small load current), the current supplied from the supply voltage source is not supplied on each cycle and the current then supplied from the collapsing field of the inductor. Instead of being a pulse width modulated (PWM) conversion process in the continuous mode, the conversion in now based on a pulse frequency modulation (PFM) in the discontinuous mode. Often the discontinuous mode is used in portable electronics such as smart cellular telephone, tablet computers, digital reader, etc. as a "sleep mode". The only current required by the system in these applications is monitoring current for system maintenance (i.e. system clocking and timers, cellular network monitoring, wireless network monitoring).

The decision to move between continuous or synchronous mode and the discontinuous or sleep is taken based on the output current of the buck DC-to-DC converter to the system load. This decision to switch between modes is made using a comparator. To prevent the comparator from toggling between the synchronous and the sleep modes, hysteresis is required. Typically hysteresis is implemented using a small voltage offset in the comparator, as described above. Many variations of these methods exist to perform the voltage offset hysteresis.

The buck DC-to-DC converter estimates the output current by measuring the voltage drop across a PMOS pass-device that is connected between the supply power source and the inductor to supply current to the inductor. The PMOS pass device is activated to connect the supply power source during the positive phase of the switching waveform, and the load current is supplied through it.

The voltage drop across PMOS pass transistor is referenced to the supply power source and is proportional to the output current. This is then averaged in one of several ways to give a voltage that is proportional to the average output current.

The typical threshold current at which the decision must be made is not large, typically around 100 mA in various applications. The impedance of the PMOS pass transistor is designed to be very small, typically less than 100 mOhms, to give high efficiency. The voltage drop across PMOS pass transistor is therefore relatively small at approximately ~10 mV as can seen from the above. This issue is further complicated in that the voltage across the PMOS pass transistor is typically scaled by the duty-cycle, and may be less than half this value ~5 mV. Further, the decision to switch to the synchronous mode is made in sleep mode, where the quiescent current available to make this decision is very low. Therefore, no amplification is possible and the system used must be kept simple. So it can be seen that the voltage offset hysteresis is not adequate for the application as shown.

SUMMARY

An object of this disclosure is to provide a comparator having a threshold voltage level with dynamic hysteresis for sensing small changes in differential input signals at the inputs, while controlling a duration that an output voltage state will remain fixed.

Another object of this disclosure is to provide a comparator having a threshold voltage level with dynamic hysteresis for preventing the output of the comparator from changing state in an unstable fashion or "chattering".

Still, another object of this disclosure is to provide a comparator having a dynamic offset threshold voltage level that permits changes in the differential input signals at the input, while controlling an offset voltage of the threshold voltage of the comparator for at least on fixed time period.

Further, another object of this disclosure is to provide an electronic circuit such as a buck DC-to-DC converter having a mode switch detection circuit for controlling the transition between a continuous or synchronous mode and a sleep or discontinuous mode to prevent instability in the output of the electronic circuit.

To accomplish at least one of these objects, a dynamic hysteresis circuit is connected to an output of a trigger circuit of a comparator that detects when a decision is made that a first input of the comparator is greater than or lesser than a second input of the comparator causing an output of the comparator to change state. Once the decision causing the change of state of the output is detected, the dynamic hysteresis circuit prevents any decisions determining that second input is now lesser than or greater than the first input from causing the output of the comparator from changing state for a fixed time period.

The dynamic hysteresis circuit is formed of a timer circuit and a hysteresis circuit. The timer circuit has a first transistor of a first conductivity type having a gate terminal connected to an in-phase output of a trigger circuit and a second transistor of the first connectivity type having a gate terminal connected to an out-of-phase output of the trigger circuit. The timer circuit has first resistor connected between a drain terminal of the first transistor and a power supply voltage source and a second resistor connected between a drain terminal of the second transistor and the power supply voltage source. A source terminal of the first transistor is connected to a first terminal of a first current source. A source terminal of the second transistor is connected to a first terminal of a second current source. A positive plate of a first capacitor is connected to a junction of the source terminal of the first transistor and the first terminal of the first current source. A positive plate of a second capacitor is connected to a junction of the source terminal of the second transistor and the first terminal of the second current source. A negative plate of the first capacitor is connected to a first terminal of a third current source. A negative plate of the second capacitor is connected to a first terminal of a fourth current source. The second terminals of the first, second, third and fourth current sources are connected to the ground reference voltage source.

The hysteresis circuit is formed of a third and fourth transistors of the first conductivity types. The third transistor has a gate terminal connected to the junction of the connection of the negative plate of the first capacitor and the first terminal of the fourth current source of the timer circuit. The fourth transistor has a gate terminal connected to the junction of the connection of the negative plate of the second capacitor and the first terminal of the third current source of the timer circuit. The source terminals of the third and fourth transistors are connected to the ground reference voltage source. The drain terminal of the third transistor is connected to an out-of-phase output of a differential input amplifier of the comparator. The drain terminal of the fourth transistor is connected to an in-phase output of the differential input amplifier of the comparator. The third and fourth transistors when activated divert current from the differential amplifier for providing an offset to a threshold voltage of the differential amplifier for the at least one fixed time period to prevent the output terminals of the comparator from switching when any decisions determining that second input is now lesser than or greater than the first input are detected.

In various embodiments, the first, second, third, and fourth current sources are programmable to adjust the at least one fixed time period to eliminate unwanted changing of the state of the output of the comparator when any decisions determining that second input is now lesser than or greater than the first input are detected too quickly. The ability to program the first, second, third, and fourth current sources permits the setting of the hysteresis voltages of the threshold voltage of the input of the comparator.

In other embodiments, the capacitance value of the first and second capacitors is programmable for adjusting the duration of the at least one fixed time period. The first and second capacitors include a plurality of switched capacitor circuits arranged in series and/or in parallel for adjusting the at least one fixed time period.

In other embodiments of this disclosure that accomplish at least one of these objects, an electronic circuit such as a DC-to-DC converter has a comparator with a dynamic hysteresis circuit. The dynamic hysteresis circuit is connected to an output of a trigger circuit of the comparator that detects when a decision is made that a first input of the comparator is greater than or lesser than a second input of the comparator causing an output of the comparator to change state. Once the decision causing the change of state of the output is detected, any decisions determining that second input is now lesser than or greater than the first input are prevented from causing the output of the comparator from changing state for at least one fixed time period. The structure of the comparator with the dynamic hysteresis circuit is as described above.

In still other embodiments of this disclosure that accomplish at least one of these objects, a comparator has a dynamic offset circuit connected to an output of a trigger circuit of the comparator that detects when a decision is made that a first input of the comparator is greater than or lesser than a second input of the comparator causing an output of the comparator to change state. Once the decision causing the change of state of the output is detected, any decisions determining that second input is now lesser than or greater than the first input are prevented from causing the output of the comparator from changing state for at least one fixed time period.

The dynamic offset circuit is formed of a timer circuit and a threshold offset current circuit. The timer circuit has a first transistor of a first conductivity type having a gate terminal connected to an in-phase output of the trigger circuit and a second transistor of the first connectivity type having a gate terminal connected to an out-of-phase output of the trigger circuit. The timer circuit has first resistor connected between a drain terminal of the first transistor and a power supply voltage source and a second resistor connected between a drain terminal of the second transistor and the power supply voltage source. A source terminal of the first transistor is connected to a first terminal of a first current source. A source terminal of the second transistor is connected to a first terminal of a second current source. A positive plate of a first capacitor is connected to a junction of the source terminal of the first transistor and the first terminal of the first current source. A positive plate of a second capacitor is connected to a junction of the source terminal of the second transistor and the first terminal of the second current source. A negative plate of the first capacitor is connected to a first terminal of a third current source. A negative plate of the second capacitor is connected to a first terminal of a fourth current source. The second terminals of the first, second, third and fourth current sources are connected the ground reference voltage source.

The threshold offset circuit is formed of a third and fourth transistors of the first conductivity types. The third transistor has a gate terminal connected to the junction of the connection of the negative plate of the first capacitor and the first terminal of the fourth current source. The fourth transistor has a gate terminal connected to the junction of the connection of the negative plate of the second capacitor and the first terminal of the third current source. The source terminals of the third and fourth transistors are connected to the ground reference voltage source. The drain terminal of the third transistor is connected to an out-of-phase output of a differential input amplifier of the comparator. The drain terminal of the fourth transistor is connected to an in-phase output of the differential input amplifier of the comparator. The third and fourth transistors when activated provide an offset current through the input stage of the comparator thus offsetting the threshold voltage of the differential input amplifier for the at least one fixed time period to prevent the output terminals of the comparator from switching when any decisions determining that second input is now lesser than or greater than the first input are detected.

Further, in other embodiments of this disclosure that accomplish at least one of these objects, a method for forming a comparator that has dynamic hysteresis begins by forming a dynamic hysteresis circuit. The method continues by connecting the dynamic hysteresis to an output of a trigger circuit of the comparator that detects when a decision is made that a first input of the comparator is greater than or lesser than a second input of the comparator causing an output of the comparator to change state. The method further continues by preventing any decisions determining that second input is now lesser than or greater than the first input are prevented from causing the output of the comparator from changing state for at least one fixed time period, once the decision causing the change of state of the output is detected.

The step of forming the dynamic hysteresis circuit includes the steps of forming a timer circuit and a hysteresis circuit. The timer circuit has a first transistor of a first conductivity type having a gate terminal connected to an in-phase output of the trigger circuit and a second transistor of the first connectivity type having a gate terminal connected to an out-of-phase output of the trigger circuit. The timer circuit has first resistor connected between a drain terminal of the first transistor and a power supply voltage source and a second resistor connected between a drain terminal of the second transistor and the power supply voltage source. A source terminal of the first transistor is connected to a first terminal of a first current source. A source terminal of the second transistor is connected to a first terminal of a second current source. A positive plate of a first capacitor is connected to a junction of the source terminal of the first transistor and the first terminal of the first current source. A positive plate of a second capacitor is connected to a junction of the source terminal of the second transistor and the first terminal of the second current source. A negative plate of the first capacitor is connected to a first terminal of a third current source. A negative plate of the second capacitor is connected to a first terminal of a fourth current source. The second terminals of the first, second, third and fourth current sources are connected the ground reference voltage source.

The hysteresis circuit is formed of a third and fourth transistors of the first conductivity types. The third transistor has a gate terminal connected to the junction of the connection of the negative plate of the first capacitor and the first terminal of the fourth current source. The fourth transistor has a gate terminal connected to the junction of the connection of the negative plate of the second capacitor and the first terminal of the third current source. The source terminals of the third and fourth transistors are connected to the ground reference voltage source. The drain terminal of the third transistor is connected to an out-of-phase output of a differential input amplifier of the comparator. The drain terminal of the fourth transistor is connected to an in-phase output of the differential input amplifier of the comparator. The third and fourth transistors when activated provide an offset to a threshold voltage of the differential amplifier for the at least one fixed time period to prevent the output terminals of the comparator from switching when any decisions determining that second input is now lesser than or greater than the first input are detected.

In various embodiments, the forming of the first, second, third, and fourth current sources includes programming the first, second, third, and fourth current sources to adjust the at least one fixed time period to eliminate unwanted changing of the state of the output of the comparator when any decisions determining that second input is now lesser than or greater than the first input are detected too quickly. The step of programming the first, second, third, and fourth current sources permits the setting of the hysteresis voltages of the threshold voltage of the input of the comparator.

In other embodiments, the step of forming the first and second capacitors includes programming the capacitance value of the first and second capacitors for adjusting the duration of the at least one fixed time period. For programming the first and second capacitors, the first and second capacitors are formed of a plurality of switched capacitor circuits arranged in series and/or in parallel for adjusting the at least one fixed time period.

DETAILED DESCRIPTION

The comparator of this disclosure provides dynamic hysteresis detects when a decision is made that one input of the comparator has a voltage level with a magnitude that is greater than or less than the magnitude of the voltage level at another input of the comparator. When the decision is decided and the output or outputs of the comparator have changed state, a dynamic hysteresis circuit prevents the decision being changed for at least one fixed time period. The at least one fixed period of time is being defined as the single hysteresis time period where the hysteresis time period is equal for a period of time when the output or outputs of the comparator are not allowed to change. Alternately the at least one fixed period of time is being defined as the two hysteresis time periods where the hysteresis time periods have differing periods of time when the output or outputs of the comparator are not allowed to change. The delay for the output or outputs of the comparator transitioning from a low level to a high level are different from the delay time for the output or outputs of the comparator transitioning from a high level to a low level.

The dynamic hysteresis circuit, in various embodiments of the comparator of this disclosure, has a programmable hysteresis in that the time period may be programmed and changed easily. The programming of the dynamic hysteresis circuit is the result of altering a capacitance value or a discharging current of a timer circuit within the dynamic hysteresis circuit.

The dynamic hysteresis circuit of this disclosure is implemented such that it does not to disturb the input voltages and the time period of the hysteresis is independent of the output impedance of the signals being sensed. The hysteresis circuit is connected such that the hysteresis circuit is triggered by a change in output of the comparator. In various embodiments of the hysteresis circuit of this disclosure, the change in output sets the voltage across one or more capacitors. This voltage across the capacitors prevents a new decision from being made, while the capacitors are discharged over a time period by adding an offset current through the differential input pair of transistors of the comparator to adjust the threshold of the differential input pair of transistors.

Figure 1A:
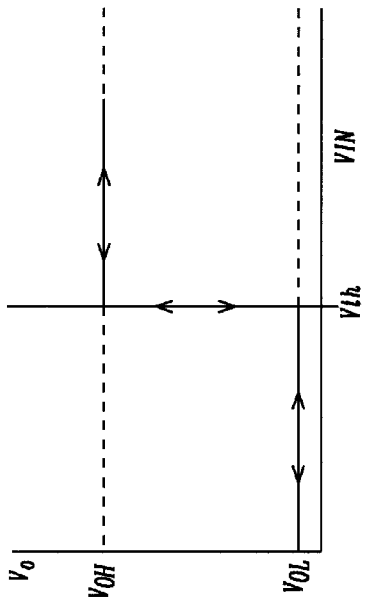
FIGS. 1a-1c illustrate a comparator of the prior art without hysteresis.
Figure 1B:
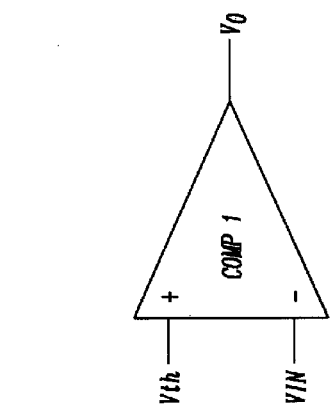
Figure 1C:
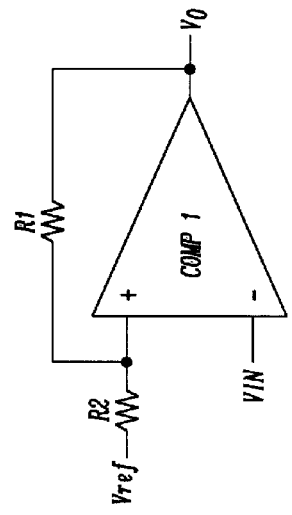
Figure 1D:
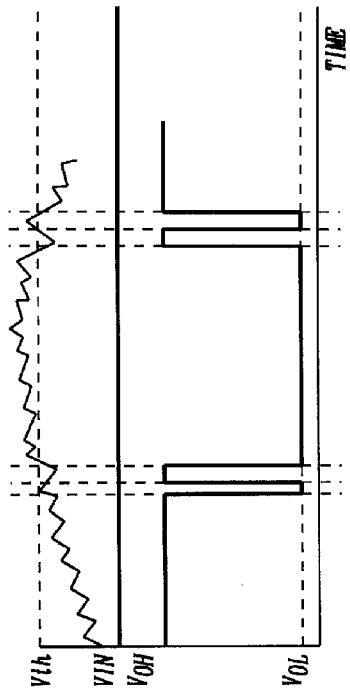
FIGS. 1d-1h illustrate the structure and operation of a comparator of the prior art with hysteresis.
Figure 1E:
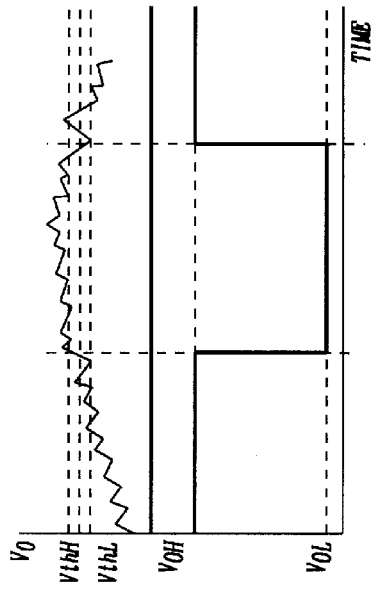
Figure 1F:
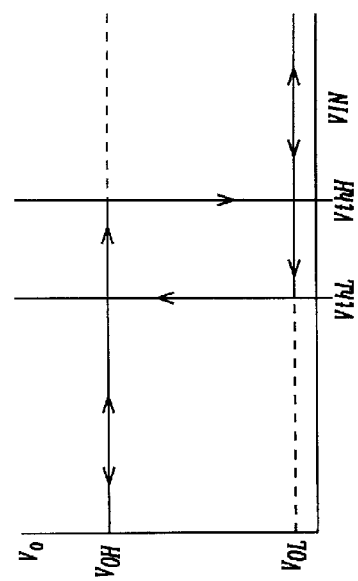
Figure 1G:
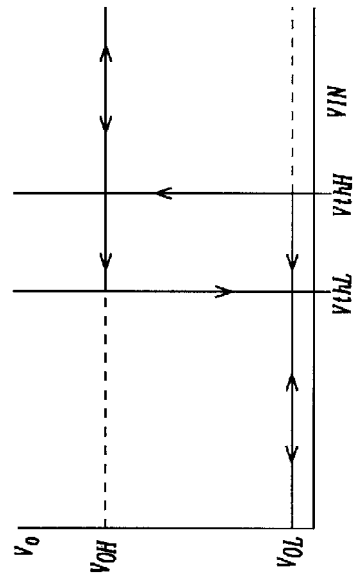
Figure 1H:
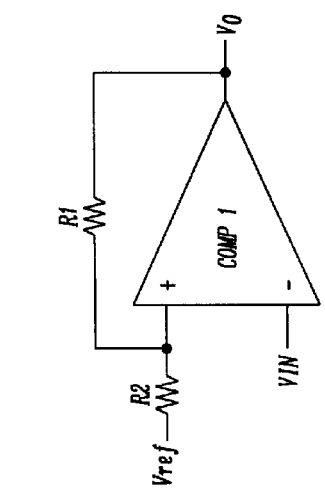
Figure 2:
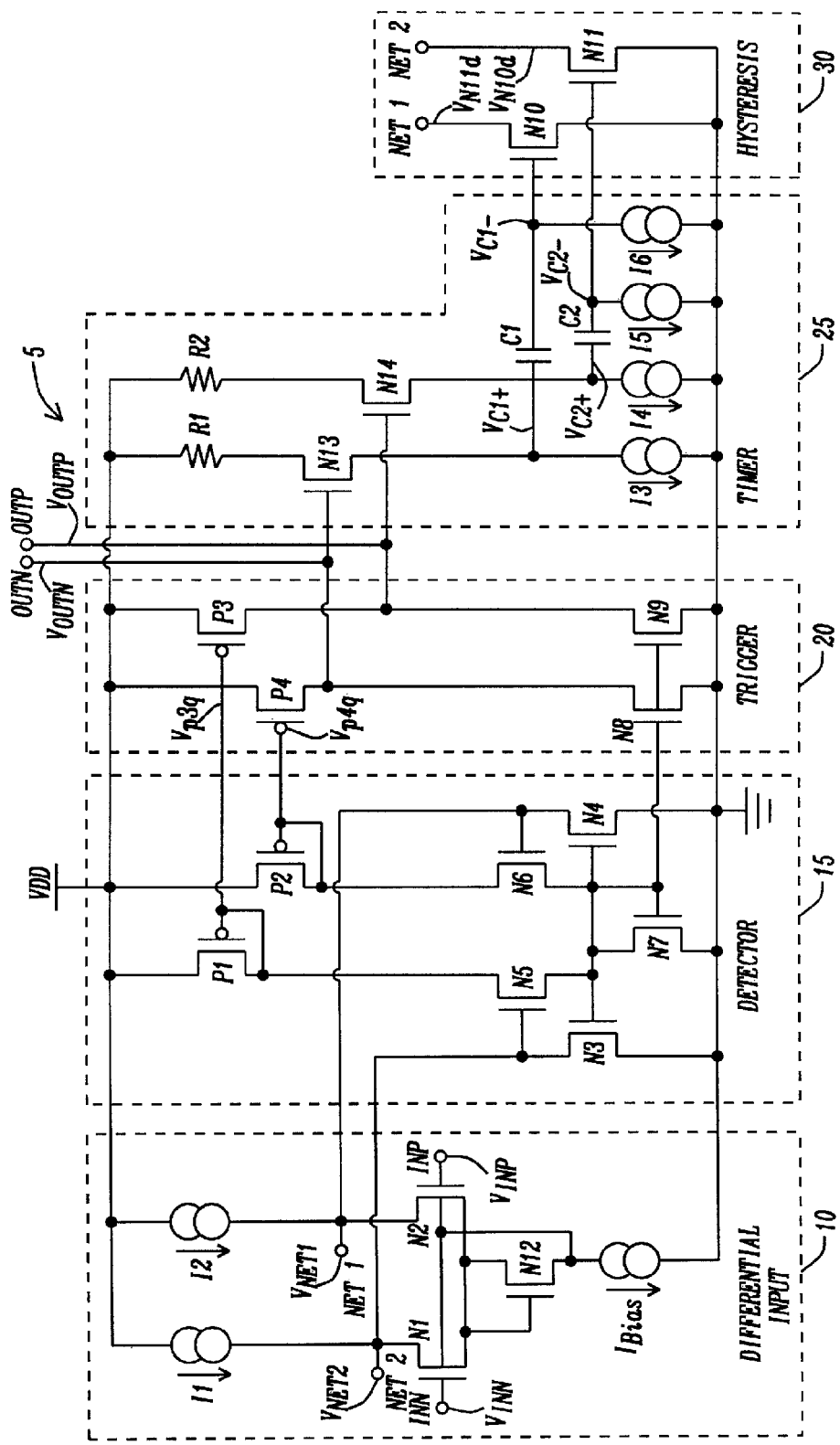
FIG. 2 is a schematic of a first implementation of a dynamic hysteresis comparator embodying the principles of the present disclosure.
Figure 3A:
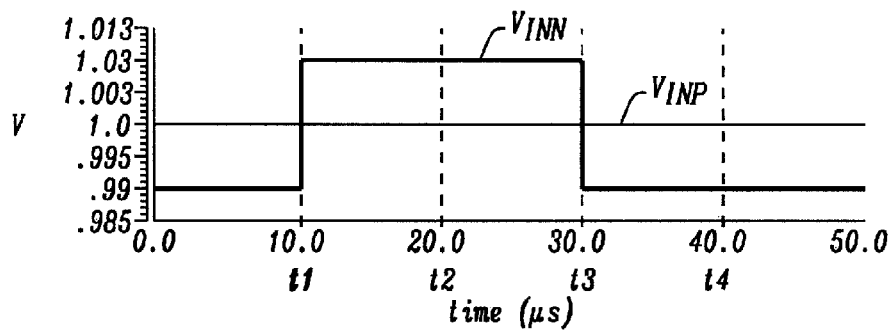
FIGS. 3a-3g are a set of plots of signals within the dynamic hysteresis comparator embodying the principles of the present disclosure of FIG. 2.
Figure 3B:
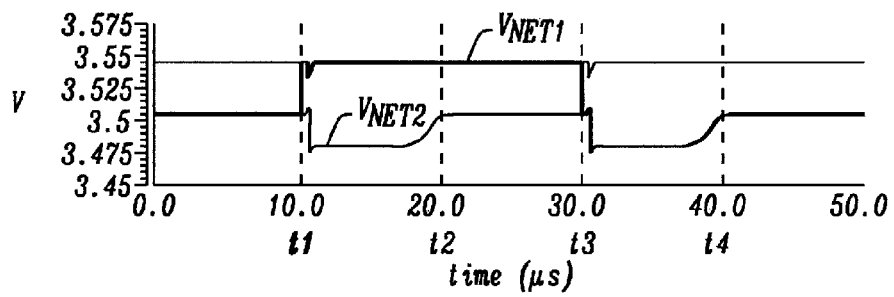
Figure 3C:
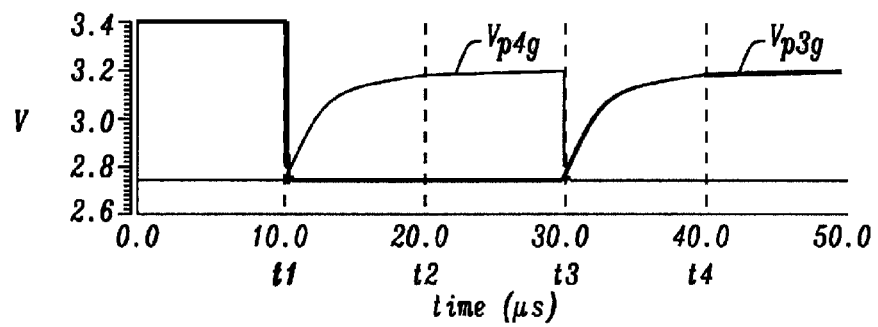
Figure 3D:
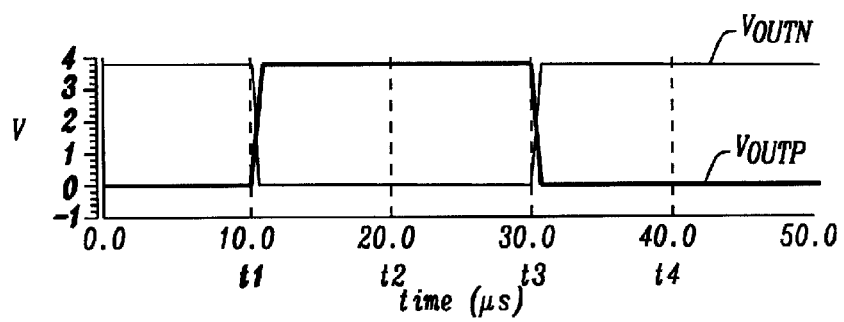
Figure 3E:
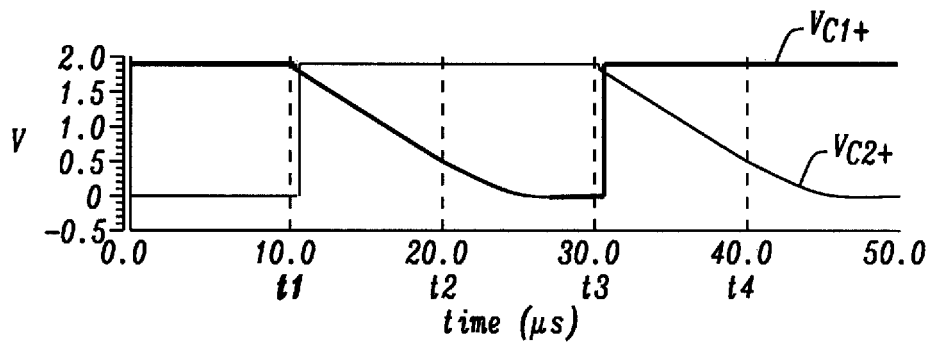
Figure 3F:
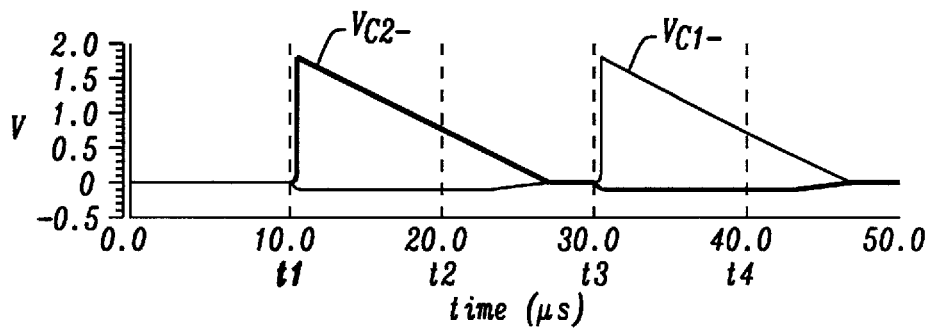
Figure 3G:
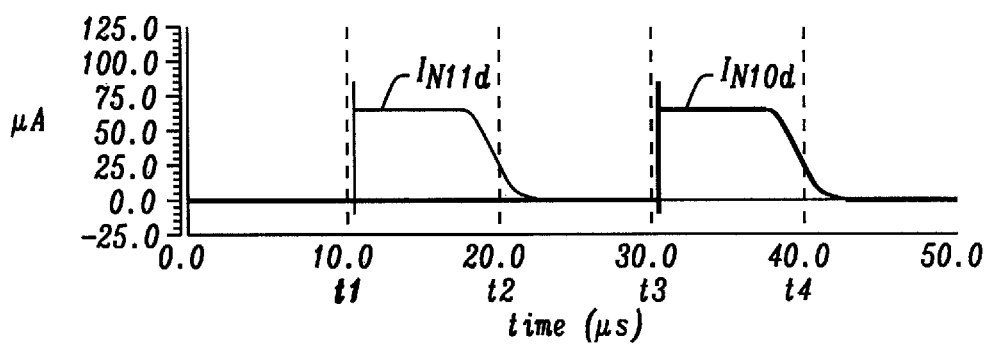

FIG. 2 is a schematic of a first implementation of a dynamic hysteresis comparator 5 embodying the principles of the present disclosure. The dynamic hysteresis comparator 5 has a differential input circuit 10 that is connected to an in-phase terminal INP and an out-of-phase terminal INN. The in-phase terminal INP is connected to a gate of a first NMOS transistor N1 of a differential pair of NMOS transistors N1 and N2 and the out-of-phase terminal INN is connected to a gate of a second NMOS transistor N2 of the differential pair of NMOS transistors N1 and N2. The sources of the differential pair of NMOS transistors N1 and N2 are commonly connected to a cathode formed of a gate and drain of a diode-connected transistor N12. The anode formed of the source of the diode-connected transistor N12 is connected to the bulk of the differential pair of NMOS transistors N1 and N2 and a first terminal of the biasing current source $I_{BIAS}$. The second terminal of the biasing current source $I_{BIAS}$ is connected to the ground reference voltage source.

The drain of the first NMOS transistor N1 of a differential pair of NMOS transistors N1 and N2 is connected to a first terminal of a first current source I1 and the drain of the second NMOS transistor N2 of a differential pair of NMOS transistors N1 and N2 is connected to a first terminal of a second current source I2. The second terminals of the first and second current sources I1 and I2 are commonly connected to the power supply voltage source VDD. The common connection of the first NMOS transistor N1 and the first terminal of a first current source I1 forms the in-phase output terminal NET2 of the differential input circuit 10. The common connection of the second NMOS transistor N2 and the first terminal of a second current source I2 forms the out-of-phase output terminal NET1 of the differential input circuit 10.

If the voltages at the in-phase terminal INP and the out-of-phase terminal INN are not identical then one of the differential pair of NMOS transistors N1 and N2 will be taking more current than the other. This will force more current through the in-phase output terminal NET2 or the out-of-phase output terminal NET1 of the differential input circuit 10 to the inputs to the detector circuit 15.

The in-phase output terminal NET2 is connected to the drain of the NMOS transistor N3 and gate of the NMOS transistor N5 and the out-of-phase output terminal NET1 is connected to the drain of the NMOS transistor N4 and gate of the NMOS transistor N6. The sources of the NMOS transistor N3 and the NMOS transistor N5 are connected to the ground reference voltage source. The gates of the NMOS transistors N3 and N4, sources of the NMOS transistors N5 and N6, and the gate and drain of the NMOS transistor N7 are commonly connected to form a first output of the detector circuit 15. The drain of the NMOS transistor N5 is connected to the gate and drain of the diode connected PMOS transistor P1 and the drain of the NMOS transistor N6 is connected to the gate and drain of the diode connected PMOS transistor P2. The sources of the diode connected PMOS transistor P1 and P2 are connected to the power supply voltage source VDD. The diode connected PMOS transistor P1 and P2 respectively form active loads for the NMOS transistors N5 and N6.

The detector circuit 15 detects the input signal from the in-phase output terminal NET2 or the out-of-phase output terminal of the differential input circuit 10 and selects which is higher. The pair of NMOS transistors N5 and N6 form a "winner-takes-all" latching circuit that latches in a digital "1" state or a digital "0" state based on the voltage levels applied to the in-phase terminal INP and the out-of-phase terminal INN. The NMOS transistor N5 is used to set the bias for the trigger circuit 20 automatically.

The commonly connected gates and drains of the diode connected PMOS transistor P1 and P2 form the second and third outputs of the trigger circuit. The gates and drains of the diode connected PMOS transistors P1 and P2 are connected respectively to the gates of the PMOS transistors P3 and P4 to form a current mirror that mirrors the current passing through the pair of NMOS transistors N5 and N6 of the detector circuit 15 through PMOS transistors P3 and P4 to form the top of the trigger circuit 30. The NMOS transistors N8 and N9 each form a current source to determine whether the outputs terminals OUTN or OUTP are high or low. The drains of the NMOS transistor N8 and the PMOS transistor P3 are commonly connected to form the output terminal OUTN and the drains of the NMOS transistor N9 and the PMOS transistor P4 are commonly connected to form the output terminal OUTP. The gates of the NMOS transistors N8 and N9 are connected to the first output of the detector circuit 15. The sources of the NMOS transistors N8 and N9 are connected to the ground reference voltage source. The trigger circuit 20 takes the decision from the detector circuit 15 and creates a full-scale differential data signal at the outputs terminals OUTN and OUTP. However, either of the signals at the outputs terminals OUTN or OUTP may be taken as the output of the comparator dynamic hysteresis comparator 5. The signals at the outputs terminals OUTN or OUTP are normally buffered by conditioning circuitry (not shown).

The timer circuit 25 is formed by NMOS transistors N13 and N14, the resistors R1 and R2, the current sources I3, I4, I5, and I6 and the capacitors C1 and C2 for creating a time controlled delay to control the hysteresis. The gate of the NMOS transistor N13 is connected to the common connection of the drains of the PMOS transistor P4 that forms the out-of-phase output terminal OUTN. The gate of the NMOS transistor N14 is connected to the common connection of the drains of the PMOS transistor P3 that forms the in-phase output terminal OUTP. The drain of the NMOS transistor N13 is connected to a first terminal of the resistor R1 and the drain of the NMOS transistor N14 is connected to a first terminal of the resistor R2. The second terminals of the resistors R1 and R2 are connected to the power supply voltage source. The source of the NMOS transistor N13 is connected to a positive terminal of capacitor C1 and a first terminal of the current source I3 and the source of the NMOS transistor N14 is connected to a positive terminal of capacitor C2 and a first terminal of the current source I4. The negative plate of the capacitor C1 is connected to the first terminal of the pull down current source I5 to form a first output terminal of the timer circuit 25. The negative plate of the capacitor C2 is connected to the first terminal of the pull down current source I5 to form a second output terminal of the timer circuit 25.

The hysteresis circuit 30 is formed of the NMOS transistors N10 and N11. The negative plate of the capacitor C1 and the first terminal of the pull down current source I5 forming the first output terminal of the timer circuit 25 is connected to the gate of the NMOS transistor N10. The negative plate of the capacitor C2 and the first terminal of the pull down current source I5 forming the second output of the timer circuit 25 are connected to the gate of the NMOS transistor N11. The drain of the NMOS transistor N10 is connected to the out-of-phase output terminal NET1 of the differential input circuit 10. The drain of the NMOS transistor N11 is connected to the in-phase output terminal NET2 of the differential input circuit 10. When either of the NMOS transistors N10 and N11 is activated to be turned on, the one turned on NMOS transistor N10 or N11 diverts current from the differential pair of NMOS transistors N1 and N2, and introduces a voltage offset to the leg of the differential pair of NMOS transistors N1 and N2. This offset voltage supports the input signal applied to the in-phase terminal INP and an out-of-phase terminal INN that caused the dynamic hysteresis comparator 5 to switch its output state. The dynamic hysteresis comparator 5 is then unlikely to switch back while the offset voltage is applied to either the in-phase terminal INP or the out-of-phase terminal INN.

For example, when voltage level of the signal at the in-phase terminal INP is greater than the voltage level of the signal at the out-of-phase terminal INN, the in-phase output terminal NET2 is at a higher voltage level than the out-of-phase output terminal NET1. This causes the detector to latch such that the out-of-phase output terminal OUTN is at a voltage level representing a digital "1" and the in-phase output terminals OUTP is at a voltage level representing a digital "0". The NMOS transistor N13 is not activated and is turned off and the NMOS transistor N14 is activated and turned on. This forces the positive plate of the capacitor C1 to be negative and the positive plate of the capacitor C2 to be positive. If the time is sufficiently long after the changing of the voltage level of the signals at the in-phase terminal INP and the out-of-phase terminal INN, the negative plates of the capacitors C1 and C2 approaching the voltage level of the ground reference voltage level and the NMOS transistors N10 and N11 are deactivated to be turned off.

When voltage level of the signal at the in-phase terminal INP is changed to be less than the voltage level of the signal at the out-of-phase terminal INN, the in-phase output terminal NET2 is at a lower voltage level than the out-of-phase output terminal NET1. This causes the detector to latch such that the out-of-phase output terminal OUTN is at a voltage level representing a digital "0" and the in-phase output terminals OUTP is at a voltage level representing a digital "1". The NMOS transistor N13 is now activated and is turned on and the NMOS transistor N14 is deactivated and turned off. This forces the positive plate of the capacitor C1 to be positive and the positive plate of the capacitor C2 to be negative. The gate of the NMOS transistor N10 is now brought to a positive voltage and the NMOS transistor N10 is activated to be turned on and the offset is added to the out-of-phase terminal NET1 to prevent any changes in the state of the comparator, if the voltage level of the signal at the in-phase terminal INP is changed to be greater than the voltage level of the signal at the out-of-phase terminal INN. During the decay time of the capacitor C1, the voltage levels at the negative plates of the capacitors C1 and C2 discharge to a voltage level approaching the voltage level of the ground reference voltage level and the NMOS transistors N10 and N11 are deactivated to be turned off. During this decay time, the NMOS transistor N10 remains activated to be turned on and the offset is added to the out-of-phase terminal NET1 to prevent any changes in the state of the comparator if the voltage level of the signal at the in-phase terminal INP is changed to be greater than the voltage level of the signal at the out-of-phase terminal INN.

In various embodiments, the timing function for the timer circuit 25 for the timer leg that controls the hysteresis for the out-of-phase input INN and the timer leg that controls the hysteresis for the in-phase input INP may have different timing values. Thus the component values of the timer leg that control the offset to be added to the out-of-phase terminal NET1 are set to be different from the component values of the timer leg that control the offset to be added to the in-phase terminal NET2. The capacitor C1 may be different from the capacitor C2. The current source I3 may have a different current from the current source I4 and the current source I6 may have a different current from the current source I5.

The current sources I3, I4, I5, and I6 may be programmable to adjust the time period to eliminate unwanted changing of the state of the output of the comparator 5 when any decisions determining that in-phase terminal INP is now lesser than or greater than the out-of-phase terminal INN are detected too quickly. The ability to program the current sources I3, I4, I5, and I6 permits the setting of the hysteresis voltages of the threshold voltage of the input of the comparator 5. Variable current sources are known in the art. Further a simple solution is implementing multiple current source that collectively form each of the current sources I3, I4, I5, and I6 such that the currents through the current sources I3, I4, I5, and I6 is adjusted by switching in one of the multiple current sources as desired for each of the current sources I3, I4, I5, and I6.

Further the capacitance of the capacitors C1 and C2 maybe programmable for adjusting the duration of the hysteresis for the in-phase input INP and out-of-phase terminal INN to have different timing values. For programming the capacitors C1 and C2, the capacitors C1 and C2 are formed of a plurality of switched capacitor circuits arranged in series and/or in parallel for adjusting the hysteresis for the in-phase input INP and out-of-phase terminal INN.

The timing for the deactivation of the transistor N10 is controlled by the ratio of the capacitance of the capacitor C1 to the amount of current flowing through the current source I6 (C1/I6). The timing for the deactivation of the transistor N11 is controlled by the ratio of the capacitance of the capacitor C2 to the amount of current flowing through the current source I5 (C2/I5). The rising edge of the voltage $V_{OUTP}$ present at the in-phase output terminal OUTP causes the transistor N11 to turn on and the rising edge of the voltage $V_{OUTN}$ present at the out-of-phase output terminal OUTP causes the transistor N10 to turn on.

FIGS. 3a-3g are a set of plots of signals within the dynamic hysteresis comparator 5 embodying the principles of the present disclosure of FIG. 2. Refer to FIG. 2 and FIGS. 3a-3g for a discussion of the operation of the dynamic hysteresis comparator 5. The voltage $V_{INP}$ applied to in-phase terminal INP is a constant reference voltage $V_{TH}$. The voltage $V_{INN}$ applied to out-of-phase terminal INN is a signal that varies, in this example, from approximately 0.99V to approximately 1.01V. At the time t1, the voltage $V_{INN}$ applied to out-of-phase terminal INN changes from approximately 0.99V to approximately 1.01V. After a small delay after the change, the voltage $V_{NET2}$ at the junction of the drain of the first NMOS transistor N1 and the first terminal of a first current source I1 changes from approximately 3.545V to approximately 3.480V and the voltage $V_{NET1}$ at the junction of the drain of the second NMOS transistor N2 and the first terminal of a second current source I2 changes from approximately 3.507V to approximately 3.545V. This causes the voltage $V_{P3g}$ at the gate of the PMOS transistor P3 to fall precipitously from approximately 3.4V to approximately 2.74V while the voltage $V_{P4g}$ at the gate of the PMOS transistor P4 to rise slowly from approximately from approximately 2.74V toward approximately 3.2V. Over a period of time longer than the plot of FIG. 3c the voltage $V_{P4g}$ would ultimately reach the steady state voltage of approximately 3.4V.

The changes of the voltages $V_{P3g}$ and $V_{P4g}$ cause the output voltages $V_{OUTN}$ and $V_{OUTP}$ at sources of the PMOS transistors P3 and P4 to change as shown in FIG. 4d. The in-phase output voltage level $V_{OUTP}$ to rise from approximately 0.0V to approximately 3.9V and the out-of-phase output voltage level $V_{OUTN}$ to fall from approximately 3.9V to approximately 0.0V. The output voltages $V_{OUTN}$ and $V_{OUTP}$ cause the NMOS transistor N14 to turn on and the voltage $V_{C2+}$ at the positive terminal of the capacitor C2 to rise precipitously to the voltage of approximately 1.9V and the NMOS transistor N13 to turn off and the voltage $V_{C1+}$ at the positive terminal of the capacitor C1 to fall from the voltage of approximately 1.9V as a ramp as the capacitor C1 is discharged by the current source I3. The precipitous rise in the voltage $V_{C2+}$ at the positive terminal of the capacitor C2 causes the voltage $V_{C2-}$ at the negative terminal of the capacitor C2 to also rise precipitously to a voltage of approximately 1.8V and to fall as ramp as the capacitor C2 is discharged by the current source I5. The voltage $V_{C2-}$ causes the transistor N11 to turn on and divert current from the current source I1 to effectively modify the threshold Vth to prevent changes in the voltage $V_{INN}$ applied to out-of-phase terminal INN from being detected. The diverted current is the drain current $I_{N11d}$ of the transistor N11 that rises to a level of approximately 75 nA and causes the voltage $V_{NET2}$ to fall to the approximately 3.480V.

The slow fall of the voltage $V_{C1+}$ at the positive terminal of the capacitor C1 does not impact the voltage $V_{C1-}$ at the negative terminal of the capacitor C1 and the transistor N10 is not turned on. The falling ramp of the voltage $V_{C2-}$ keeps the transistor N11 turned on until the voltage $V_{C2-}$ has fallen to the threshold voltage of the transistor N11 at the time t2. Shortly after the time T2, the transistor N11 is turned off and the voltage $V_{NET2}$ rises to the voltage level of approximately 3.507V. The voltage threshold is now back to the original threshold as structured for the differential input circuit 10 with the voltage $V_{INP}$ applied to in-phase terminal INP as a constant reference voltage $V_{TH}$ At the time t3, the voltage $V_{INN}$ applied to out-of-phase terminal INN changes from approximately 1.01V to approximately 0.99V. After a small delay after the change, the voltage $V_{NET1}$ at the junction of the drain of the second NMOS transistor N2 and the first terminal of a second current source I2 changes from approximately 3.545V to approximately 3.480V and the voltage $V_{NET2}$ at the junction of the drain of the first NMOS transistor N1 and the first terminal of a first current source I1 changes from approximately 3.507V to approximately 3.545V. This causes the voltage $V_{P4g}$ at the gate of the PMOS transistor P4 to fall precipitously from approximately 3.4V to approximately 2.74V while the voltage $V_{P3g}$ at the gate of the PMOS transistor P3 to rise slowly from approximately from approximately 2.74V toward approximately 3.2V. Over a period of time longer than the plot of FIG. 3c the voltage $V_{P3g}$ would ultimately reach the steady state voltage of approximately 3.4V.

The changes of the voltages $V_{P3g}$ and $V_{P4g}$ cause the output voltages $V_{OUTN}$ and $V_{OUTP}$ at sources of the PMOS transistors P3 and P4 to change as shown in FIG. 4d. The out-of phase output voltage level $V_{OUTN}$ to rise from approximately 0.0V to approximately 3.9V and the in-phase output voltage level $V_{OUTN}$ to fall from approximately 3.9V to approximately 0.0V. The output voltages $V_{OUTN}$ and $V_{OUTP}$ cause the NMOS transistor N13 to turn on and the voltage $V_{C1+}$ at the positive terminal of the capacitor C1 to rise precipitously to the voltage of approximately 1.9V and the NMOS transistor N14 to turn off and the voltage $V_{C2+}$ at the positive terminal of the capacitor C2 to fall from the voltage of approximately 1.9V as a ramp as the capacitor C2 is discharged by the current source I4. The precipitous rise in the voltage $V_{C1+}$ at the positive terminal of the capacitor C1 causes the voltage $V_{C1-}$ at the negative terminal of the capacitor C1 to also rise precipitously to a voltage of approximately 1.8V and to fall as ramp as the capacitor C1 is discharged by the current source I6. The voltage $V_{C1-}$ causes the transistor N10 to turn on and divert current from the current source I2 to effectively modify the threshold Vth to prevent changes in the voltage $V_{INN}$ applied to out-of-phase terminal INN from being detected.

The diverted current is the drain current $I_{N10d}$ of the transistor N10 that rises to a level of approximately 75 nA and causes the voltage $V_{NET1}$ to fall to the approximately 3.480V.

The slow fall of the voltage $V_{C2+}$ at the positive terminal of the capacitor C2 does not impact the voltage $V_{C2-}$ at the negative terminal of the capacitor C2 and the transistor N11 is not turned on. The falling ramp of the voltage $V_{C1-}$ keeps the transistor N10 turned on until the voltage $V_{C1-}$ has fallen to the threshold voltage of the transistor N10 at the time t4. Shortly after the time T4, the transistor N10 is turned off and the voltage $V_{NET1}$ rises to the voltage level of approximately 3.507V. The voltage threshold is now back to the original threshold as structured for the differential input circuit 10 with the voltage $V_{INP}$ applied to in-phase terminal INP as a constant reference voltage $V_{TH}$ The plots as shown demonstrate the implementation of the time hysteresis that is desired to prevent ringing in the voltage $V_{INN}$ at the input terminal INN from causing instability in the sensing changes in the input voltage $V_{INN}$.

Figure 4:
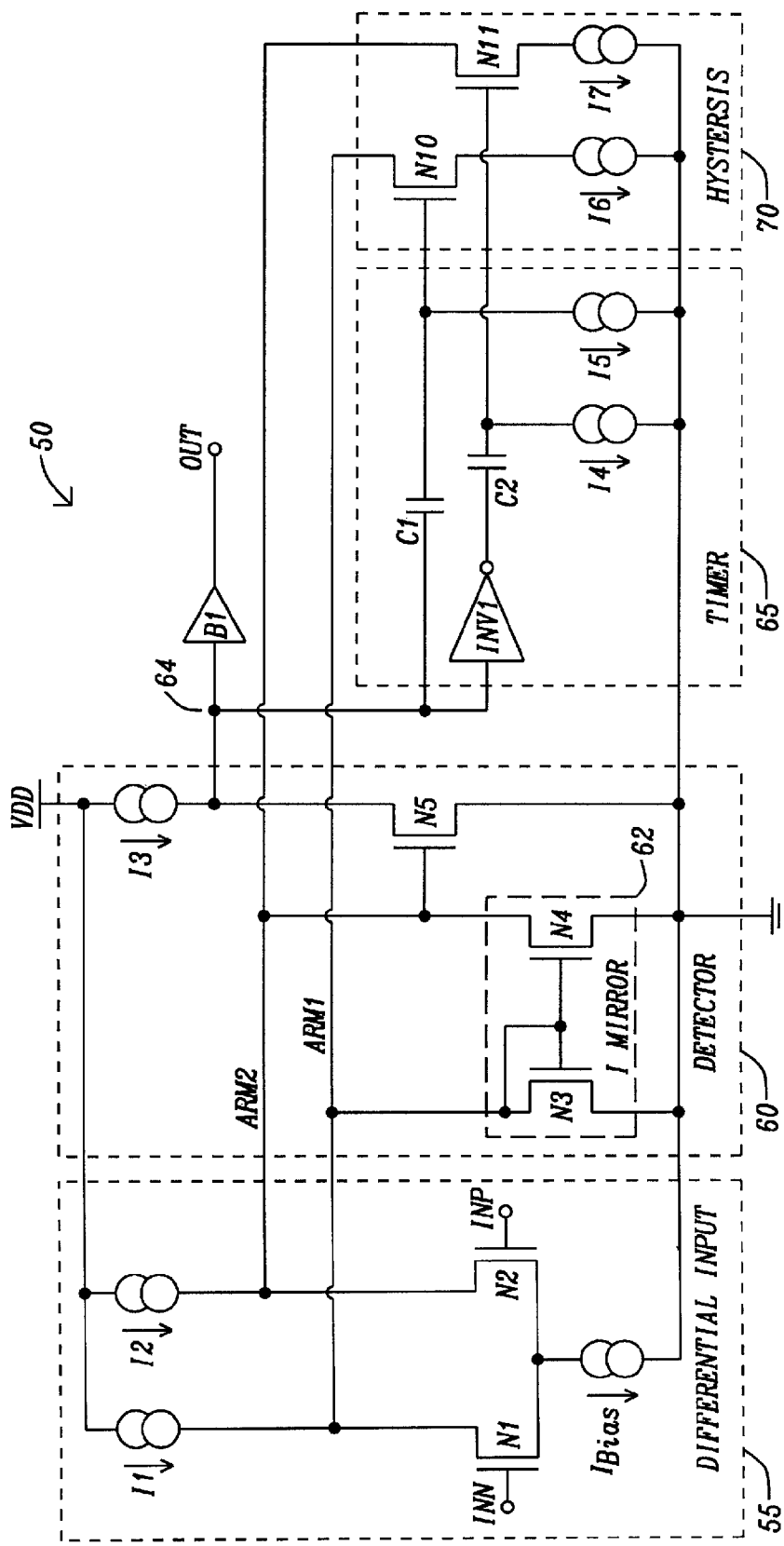
FIG. 4 is a schematic of a second implementation of a dynamic hysteresis comparator embodying the principles of the present disclosure.

FIG. 4 is a schematic of a second implementation of a dynamic hysteresis comparator 5 embodying the principles of the present disclosure. The dynamic hysteresis comparator 55 has a differential input circuit 10 that is connected to an in-phase terminal INP and an out-of-phase terminal INN. The in-phase terminal INP is connected to a gate of a first NMOS transistor N1 of a differential pair of NMOS transistors N1 and N2 and the out-of-phase terminal INN is connected to a gate of a second NMOS transistor N2 of the differential pair of NMOS transistors N1 and N2. The sources of the differential pair of NMOS transistors N1 and N2 are commonly connected to a first terminal of the biasing current source $I_{BIAS}$. The second terminal of the biasing current source $I_{BIAS}$ is connected to the ground reference voltage source.

The drain of the first NMOS transistor N1 of a differential pair of NMOS transistors N1 and N2 is connected to a first terminal of a first current source I1 and the drain of the second NMOS transistor N2 of a differential pair of NMOS transistors N1 and N2 is connected to a first terminal of a second current source I2. The second terminals of the first and second current sources I1 and I2 are commonly connected to the power supply voltage source VDD. The common connection of the first NMOS transistor N1 and the first terminal of a first current source I1 forms the in-phase output terminal ARM2 of the differential input circuit 55. The common connection of the second NMOS transistor N2 and the first terminal of a second current source I2 forms the out-of-phase output terminal ARM1 of the differential input circuit 55.

If the voltages at the in-phase terminal INP and the out-of-phase terminal INN are not identical then one of the differential pair of NMOS transistors N1 and N2 will be taking more current than the other. This will force more current through the in-phase output terminal ARM2 or the out-of-phase output terminal ARM1 of the differential input circuit 55 to the inputs to the detector circuit 60.

The in-phase output terminal ARM2 is connected to the drain of the NMOS transistor N4 and gate of the NMOS transistor N5. The out-of-phase output terminal ARM1 is connected to the drain and gate of the diode connected NMOS transistor N3 and gate of the NMOS transistor N4. The sources of the NMOS transistors N3, N4, and N5 are connected to the ground reference voltage source. The drain of the NMOS transistor N5 is connected to the first terminal of a current source I3. A second terminal of the current source I3 is connected to the power supply voltage source VDD. The drain of the NMOS transistor N5 and the first terminal of the current source I3 are commonly connected to form a first output of the detector circuit 60. The diode connected NMOS transistor N3 and the NMOS transistor N4 form a current mirror 62 where the reference leg of the current mirror 62 is connected to the out-of-phase output terminal ARM1 and the mirror leg of the current mirror is connected to the in-phase output terminal ARM2.

If a signal presented to the out-of-phase terminal INN is greater than a signal presented to the in-phase terminal INP, the NMOS transistor N1 turns on and the current from the current source I1 is transferred through the NMOS transistor N1 to the biasing current source $I_{Bias}$. The current of the current sources I1 and I2 are approximately equal to the current of the biasing current source $I_{Bias}$. With the NMOS transistor N1 turned on, the NMOS transistor N2 is turned off and the current from the current source I2 is directed to the in-phase output terminal ARM2. Since the majority of the current from the current source I1 is transferred through the NMOS transistor N1, the current in the reference leg formed by the NMOS transistor N3 of the current mirror 62 is minimal or near zero and the NMOS transistor N4 is nearly turned off. This causes the voltage across the NMOS transistor N4 to be relatively large, thus causing the NMOS transistor N5 to turn on. The current from the current source I3 flows through the NMOS transistor N5 causing the output voltage at the input of the buffer circuit B1 to be low and the output of the buffer circuit B1 to be a low level or a digital "0".

If a signal presented to the out-of-phase terminal INN is less than a signal presented to the in-phase terminal INP, the NMOS transistor N2 turns on and the current from the current source I2 is transferred through the NMOS transistor N2 to the biasing current source $I_{Bias}$. With the NMOS transistor N2 turned on, the NMOS transistor N1 is turned off and the current from the current source I1 is directed to the in-phase output terminal ARM1. Since the NMOS transistor N1 is turned off, the current in the reference leg formed by the MOST transistor N3 of the current mirror 62 is at a maximum or nearly equal to the current from the current source I1 and the NMOS transistor N4 is conducting the mirror current essentially equal to the current of the current source I1. This causes the voltage across the NMOS transistor N4 to be relatively low, thus causing the NMOS transistor N5 to turn off. The output voltage at the input of the buffer circuit B1 is relatively large and the output of the buffer circuit B1 to be a high level or a digital "1".

The inverter circuit INV1, the current sources I5 and I6, and the capacitors C1 and C2 form the timer circuit 25 for creating a time controlled delay to control the hysteresis. The output 64 of the detector 60 is connected to a positive terminal of capacitor C1 and a first terminal of the inverter INV1. The output of the inverter INV1 is connected to a positive terminal of capacitor C2. The negative plate of the capacitor C1 is connected to the first terminal of the pull down current source I5 to form a first output terminal of the timer circuit 65. The negative plate of the capacitor C2 is connected to the first terminal of the pull down current source I5 to form a second output terminal of the timer circuit 65.

The hysteresis circuit is formed of the NMOS transistors N10 and N11 and the current sources I7 and I8. The negative plate of the capacitor C1 and the first terminal of the pull down current source I6 forming the first output terminal of the timer circuit 65 is connected to the gate of the NMOS transistor N10. The negative plate of the capacitor C2 and the first terminal of the pull down current source I5 forming the second output of the timer circuit 65 are connected to the gate of the NMOS transistor N11. The drain of the NMOS transistor N10 is connected to the out-of-phase output terminal ARM1 of the differential input circuit 55. The drain of the NMOS transistor N11 is connected to the in-phase output terminal ARM2 of the differential input circuit 55. The source of the NMOS transistor N10 is connected to the first terminal of the current source I7. The source of the NMOS transistor N11 is connected to the first terminal of the current source I8. The second terminals of the current sources I7 and I8 are connected to the ground reference voltage source.

When either of the NMOS transistors N10 and N11 is activated to be turned on, the one turned on NMOS transistor N10 or N11 diverts current from the differential pair of NMOS transistors N1 and N2, and introduces a voltage offset to the leg of the differential pair of NMOS transistors N1 and N2. This offset voltage supports the input signal applied to the in-phase terminal INP and an out-of-phase terminal INN that caused the dynamic hysteresis comparator 50 to switch its output state. The dynamic hysteresis comparator 50 is then unlikely to switch back while the offset voltage is applied to either the in-phase terminal INP or the out-of-phase terminal INN.

For example, when voltage level of the signal at the in-phase terminal INP is greater than the voltage level of the signal at the out-of-phase terminal INN, the in-phase output terminal ARM2 is at a lower voltage level than the out-of-phase output terminal ARM1. This causes the detector to latch such that the output terminal 64 is at a low voltage level. The output of the inverter INV1 is set to the voltage level of the digital "1". This forces the positive plate of the capacitor C1 to be negative and the positive plate of the capacitor C2 to be positive. If the time is sufficiently long after the changing of the voltage level of the signals at the in-phase terminal INP and the out-of-phase terminal INN, the negative plates of the capacitors C1 and C2 approaching the voltage level of the ground reference voltage level and the NMOS transistors N10 and N11 are deactivated to be turned off.

When voltage level of the signal at the in-phase terminal INP is changed to be less than the voltage level of the signal at the out-of-phase terminal INN, the in-phase output terminal ARM2 is at a higher voltage level than the out-of-phase output terminal ARM1. This causes the detector to latch such that the output terminal 64 is at a high voltage level. The output of the inverter INV1 is set to the voltage level of the digital "0". This forces the positive plate of the capacitor C1 to be positive and the positive plate of the capacitor C2 to be negative. The gate of the NMOS transistor N10 is now brought to a positive voltage and the NMOS transistor N10 is activated to be turned on and the offset is added to the out-of-phase terminal ARM1 to prevent any changes in the state of the comparator, if the voltage level of the signal at the in-phase terminal INP is changed to be greater than the voltage level of the signal at the out-of-phase terminal INN. During the decay time of the capacitor C1, the voltage levels at the negative plates of the capacitors C1 and C2 discharge to a voltage level approaching the voltage level of the ground reference voltage level and the NMOS transistors N10 and N11 are deactivated to be turned off. During this decay time, the NMOS transistor N10 remains activated to be turned on and the offset is added to the out-of-phase terminal ARM1 to prevent any changes in the state of the comparator if the voltage level of the signal at the in-phase terminal INP is changed to be greater than the voltage level of the signal at the out-of-phase terminal INN.

In various embodiments, the timing function for the timer circuit 65 for the timer leg that controls the hysteresis for the out-of-phase input INN and the timer leg that controls the hysteresis for the in-phase input INP may have different timing values. Thus the component values of the timer leg that control the offset to be added to the out-of-phase terminal ARM1 are set to be different from the component values of the timer leg that control the offset to be added to the in-phase terminal ARM2. The capacitor C1 may be different from the capacitor C2. The current source I5 may have a different current from the current source I6.

The current sources I5, I6, I7, and I8 may be programmable to adjust the time period to eliminate unwanted changing of the state of the output of the comparator 5 when any decisions determining that in-phase terminal INP is now lesser than or greater than the out-of-phase terminal INN are detected too quickly. The ability to program the current sources I5, I6, I7, and I8 permits the setting of the hysteresis voltages of the threshold voltage of the input of the comparator 5. Variable current sources are known in the art. Further a simple solution is implementing multiple current source that collectively form each of the current sources I5, I6, I7, and I8 such that the currents through the current sources I5, I6, I7, and I8 is adjusted by switching in one of the multiple current sources as desired for each of the current sources I5, I6, I7, and I8.

Further the capacitance of the capacitors C1 and C2 maybe programmable for adjusting the duration of the hysteresis for the in-phase input INP and out-of-phase terminal INN to have different timing values. For programming the capacitors C1 and C2, the capacitors C1 and C2 are formed of a plurality of switched capacitor circuits arranged in series and/or in parallel for adjusting the hysteresis for the in-phase input INP and out-of-phase terminal INN.

The timing for the deactivation of the transistor N10 is controlled by the ratio of the capacitance of the capacitor C1 to the amount of current flowing through the current source I6 (C1/I5). The timing for the deactivation of the transistor N11 is controlled by the ratio of the capacitance of the capacitor C2 to the amount of current flowing through the current source I5 (C2/I6). The rising edge of the voltage $V_{OUTP}$ present at the in-phase output terminal OUTP causes the transistor N11 to turn on and the rising edge of the voltage $V_{OUTN}$ present at the out-of-phase output terminal OUTP causes the transistor N10 to turn on.

In some embodiments, a secondary hysteresis is added to the current mirror 62 of the detector 60. This provides a further level of control of the dynamic hysteresis to prevents the decision being changed for a time period that maybe fixed or programmable.

Figure 5:
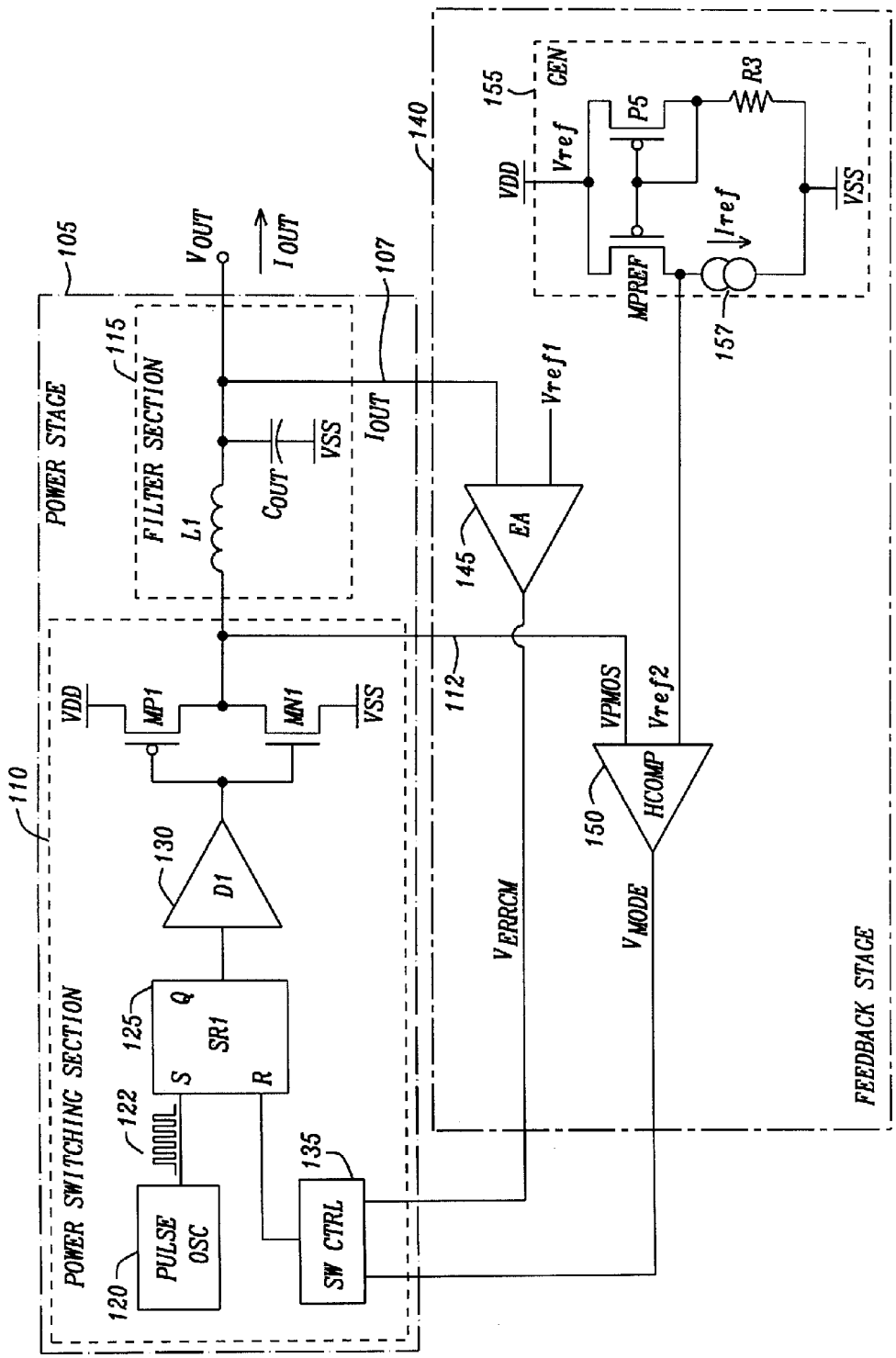
FIG. 5 is a schematic of a buck DC-to-DC converter including a dynamic hysteresis comparator embodying the principles of the present disclosure.

FIG. 5 is a schematic of a buck DC-to-DC converter including a dynamic hysteresis comparator embodying the principles of the present disclosure. The power switching section 110 of the power stage 105 has a pulse oscillator 120 that generates a set of pulses 122 at a fixed repetition rate. The set of pulses 122 is applied to the set input S of a set-reset latch 125 is applied to an input of a driver circuit 130. The output of the driver circuit 130 is applied to the gate of the PMOS transistor MP1 and to the gate of the NMOS transistor MN1. The source of the PMOS transistor MP1 is connected to the power supply voltage source VDD and the source of the NMOS transistor MN1 is connected to the substrate supply voltage source VSS. The substrate supply voltage source VSS is often the ground reference voltage source, but in some applications is a negative voltage level. The commonly connected drains of the PMOS transistor MP1 and the NMOS transistor MN1 are connected to an input terminal of the filter section 115. The input terminal is a first terminal of an inductor L1. When the set of pulses 122 as applied to the set input S of the set-reset latch 125, triggers the set-reset latch 125 such that the PMOS transistor MP1 is turned on and the NMOS transistor MN1 is turned off, a current from the power supply voltage source VDD from the first terminal of the inductor L1 out the second terminal of the inductor L1 into the first terminal of the output capacitor $C_{OUT}$ and to the substrate supply voltage source VSS. The output voltage $V_{OUT}$ is present at the junction of the second terminal of the inductor L1 and the output capacitor $C_{OUT}$.

It is known in the art, that the voltage ($V_{L1}$) across the inductor L1 is determined by the formula:

$$V_{L1} = L \frac{dI_L}{dt}$$

The output voltage $V_{OUT}$ is equal to the difference of the power supply voltage source VDD and the voltage $V_{L1}$ across the inductor L1 in the on state and equal to the negative of the voltage $-V_{L1}$ across the inductor L1 in the off state. The duty cycle of the buck DC-to-DC converter determines the on state time and the off state time. It can be shown that the output voltage $V_{OUT}$ is equal to the duty cycle D of the current mode buck converter multiplied by the voltage level of the power supply voltage source VDD.

The feedback section 140 has two inputs. The first input 107 is the output voltage $V_{OUT}$ at the first terminal of the output capacitor $C_{OUT}$ and the second input 112 is a sensing of voltage across the PMOS transistor MP1. The voltage drop across the PMOS transistor MP1 is measured and used to calculate an estimate of the output current $I_{OUT}$ of the buck DC-to-DC converter the during the positive phase of the switching waveform when the PMOS transistor MP1 is turned on, and the output load current $I_{OUT}$ is supplied through the PMOS transistor MP1. The voltage drop $V_{MP1}$ across the PMOS transistor MP1 is referred to the power supply voltage source VDD and is proportional to the output current $I_{OUT}$. This is then averaged in one of several ways to give a voltage that is proportional to the average output load current $I_{OUT}$.

The first input of the feedback section 140 is applied to first input of an error amplifier 145. A second input of the error amplifier 145 receives a reference voltage level Vref. The output the error amplifier 145 is an error voltage that is applied to a first input of a switching controller 135. When the error voltage $V_{ERROR}$ indicates that the output current $I_{OUT}$ is greater than a high current level $I_{HI}$ as established from the reference voltage Vref, the switch controller 135 triggers the reset input R of the set-reset latch 30 and the PMOS transistor MP1 is turned off and the NMOS transistor MN1 is turned on. The first terminal of the inductor L1 is then connected through the NMOS transistor MN1 to the substrate supply voltage source VSS. The slope of the output current reverses direction and the output current decreases at the slope determined by the magnitude of the output voltage $V_{OUT}$ and value of the inductor L1. At the next pulse of the pulse oscillator 120, the switching transistors MP1 and MN1 are toggled in state to generate saw tooth current wave for the output current $I_{OUT}$.

In addition to controlling the resetting of the set-reset latch 125 during the continuous mode or pulse width modulation mode (PWM), the switching controller 135 determines whether the buck DC-to-DC converter is to be operated in the discontinuous mode or pulse frequency modulation mode (PFM). When the buck DC-to-DC converter is operated in the discontinuous mode, portable electronic systems are able to enter into or emerge from the "sleep mode". The switching controller 135 receives a mode status voltage level $V_{MODE}$ indicating the average current demand placed on the PMOS transistor MP1 by measuring the average voltage drop $V_{MP1}$ across the PMOS transistor MP1. The voltage drop $V_{MP1}$ across the PMOS transistor MP1 is applied to a first input of a dynamic hysteresis comparator 150 that has a first input that is connected to the commonly connected drains of the PMOS transistor MP1 and the NMOS transistor MN1. The connection at the commonly connected drains of the PMOS transistor MP1 and the NMOS transistor MN1 measures the voltage drop across the PMOS transistor MP1 to estimate the output current $I_{OUT}$. The output current $I_{OUT}$ is estimated during the positive phase of the switching waveform when the PMOS transistor MP1 is turned on and the output load $I_{OUT}$ is supplied from the power supply voltage source VDD. This gives a voltage drop that is referred to the power supply voltage source VDD and is proportional to the output current $I_{OUT}$. The measured voltage drop is then averaged in one of several ways to give a voltage that is proportional to the average output current $I_{OUT}$.

The second input of the dynamic hysteresis comparator 150 is connected to receive a reference voltage Vref from a voltage reference generator 155. The voltage reference generator 155 has a PMOS transistor MPREF that is matched to the PMOS transistor MP1. The gate of the PMOS transistor MPREF is connected to the gate and drain of the diode connected PMOS transistor P5. The gate and drain of the diode connected PMOS transistor P5 is connected to a first terminal of a resistor R3. The second terminal of the resistor R3 is connected to the substrate supply voltage source VSS. The source of the PMOS transistor MPREF is connected to the power supply voltage source VDD. The value of the resistance of the resistor R3 is set so as to establish the reference current IREF. The drain of the PMOS transistor MPREF is connected to a first terminal of the reference current sink 157. The second terminal of the reference current sink 157 is connected to the substrate supply voltage source VSS. The junction of the drain of the PMOS transistor MPREF and the first terminal of the reference current sink 132 provides the voltage level of the reference voltage Vref to the second terminal of the dynamic hysteresis comparator 150. The structure and function for the dynamic hysteresis comparator 150 is as described in FIG. 2.

Figure 6A:
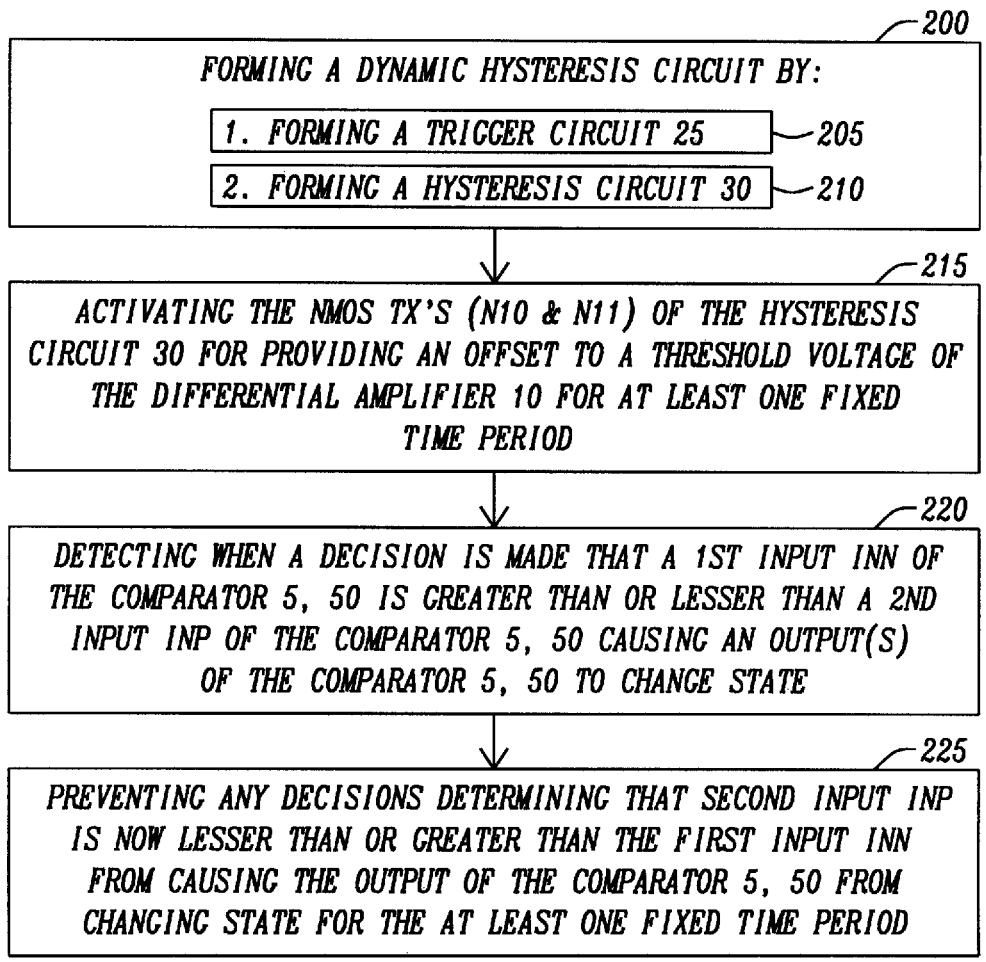
FIGS. 6a-6c are a flowchart of a method for forming a dynamic hysteresis comparator embodying the principles of the present disclosure.
Figure 6B:
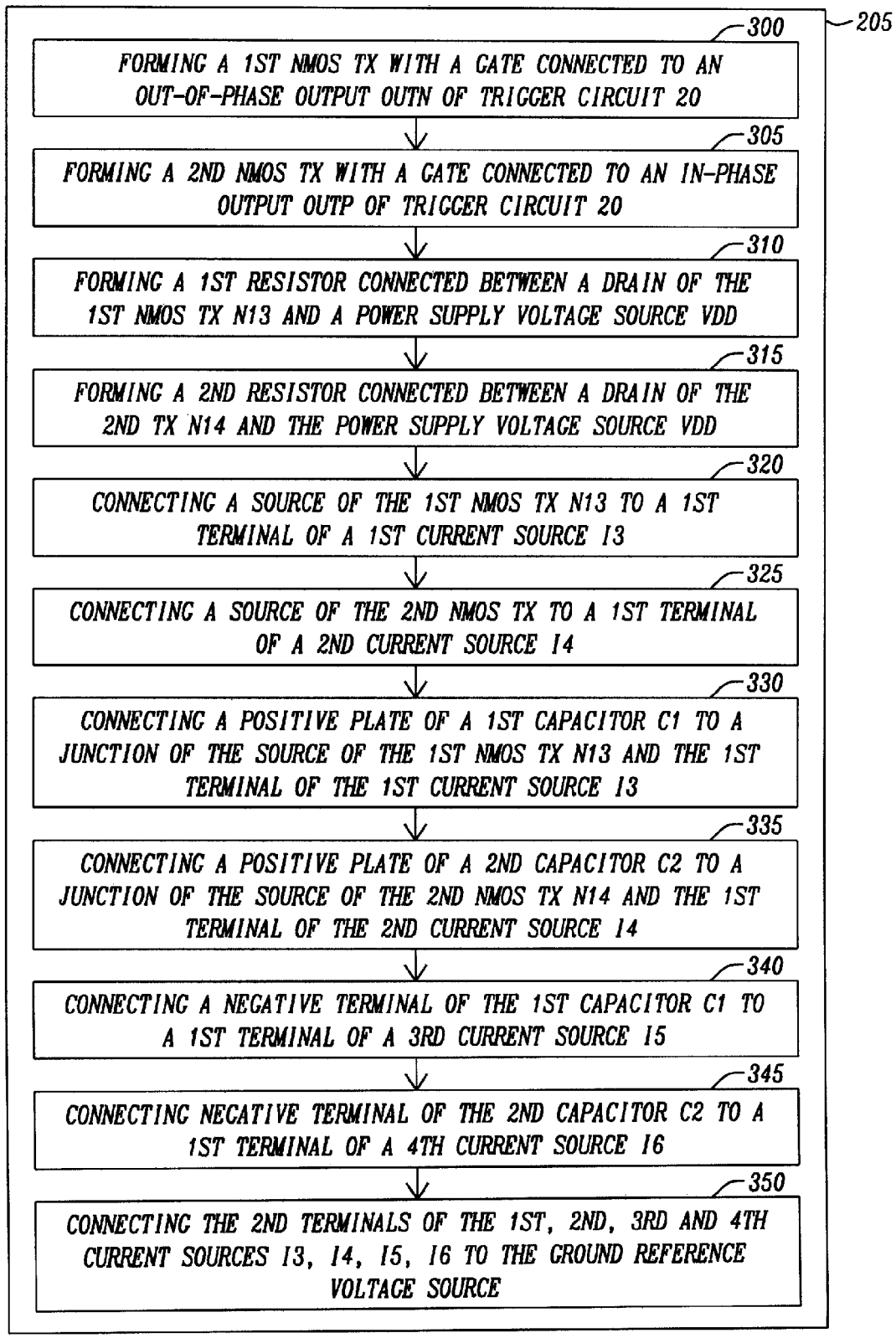

FIGS. 6a-6e are flowcharts of a method for forming a dynamic hysteresis comparator embodying the principles of the present disclosure. The flowcharts 7b and 7c are coordinated with FIG. 2 and the flowcharts 7d and 7e are coordinated with FIG. 4 in terms of forming a timer circuit and a hysteresis circuit. The method for forming a comparator that has dynamic hysteresis begins by forming (Box 200) a dynamic hysteresis circuit. The step of forming (Box 200) the dynamic hysteresis circuit includes the step of forming (Box 205) a timer circuit and the step of forming (Box 210) a hysteresis circuit. In FIG. 6b, the timer circuit 25 is formed by forming (Box 300) a first transistor N13 of a first conductivity type having a gate terminal connected to an out-of-phase output OUTN of the trigger circuit 20 and by forming (Box 305) a second transistor N14 of the first connectivity type having a gate terminal connected to an in-phase output OUTP of the trigger circuit 20. The forming (Box 205) of the timer circuit 25 continues with forming (Box 310) a first resistor R1 connected between a drain terminal of the first transistor N13 and a power supply voltage source VDD and forming (Box 315) a second resistor R2 connected between a drain terminal of the second transistor N14 and the power supply voltage source VDD. A source terminal of the first transistor N13 is connected (Box 320) to a first terminal of a first current source I3. A source terminal of the second transistor N14 is connected (Box 325) to a first terminal of a second current source I4. A positive plate of a first capacitor C1 is connected (Box 330) to a junction of the source terminal of the first transistor N13 and the first terminal of the first current source I3. A positive plate of a second capacitor C2 is connected (Box 335) to a junction of the source terminal of the second transistor N14 and the first terminal of the second current source I4. A negative plate of the first capacitor C1 is connected (Box 340) to a first terminal of a third current source I5. A negative plate of the second capacitor C2 is connected (Box 345) to a first terminal of a fourth current source I6. The second terminals of the first, second, third and fourth current sources I3, I4, I5, and I6 are connected (Box 350) the ground reference voltage source.

Figure 6C:
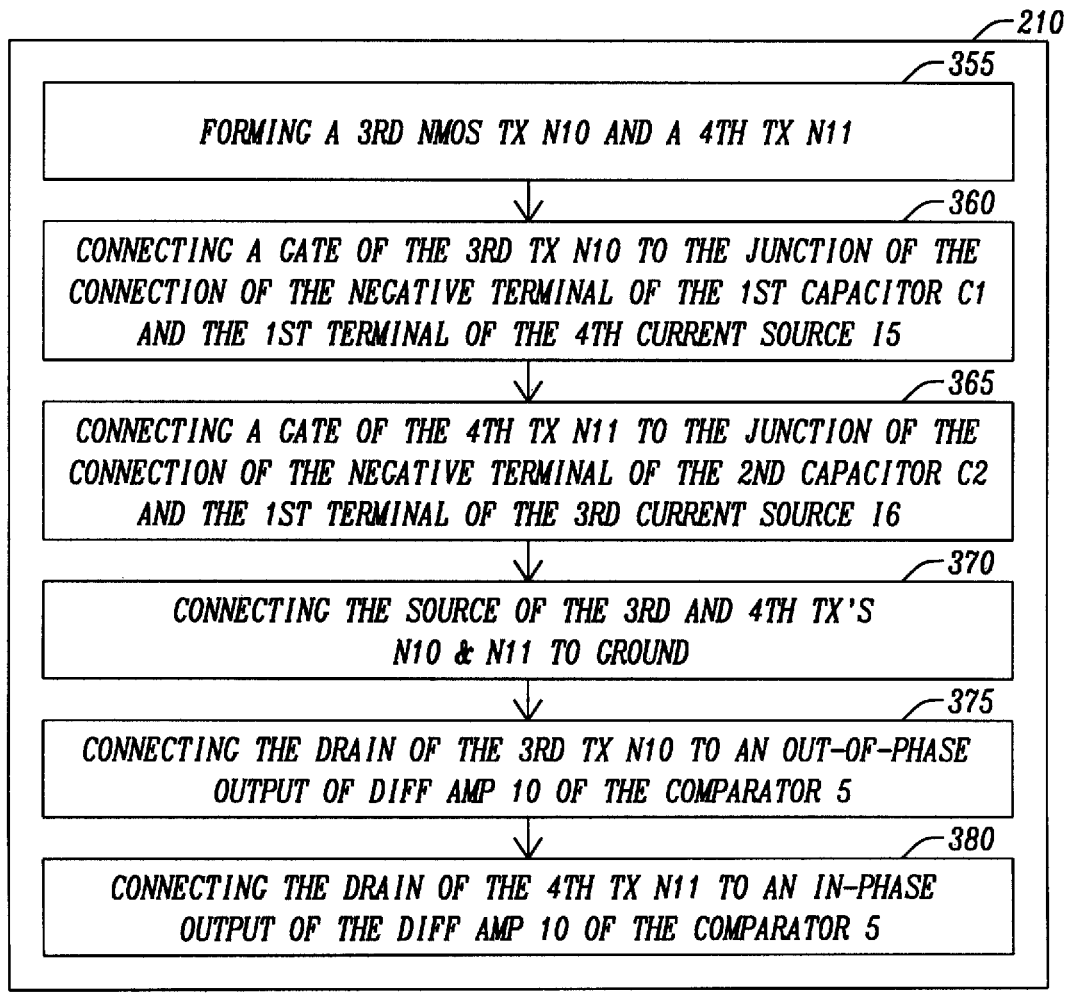

Referring to FIG. 6c, the hysteresis circuit 30 is formed (Box 210) by forming (Box 355) a third transistor N10 and a fourth transistor N11 of the first conductivity type. The third transistor N13 has a gate terminal connected (Box 360) to the junction of the connection of the negative plate of the first capacitor C1 and the first terminal of the fourth current source I6. The fourth transistor N11 has a gate terminal connected (Box 365) to the junction of the connection of the negative plate of the second capacitor C2 and the first terminal of the third current source I5. The source terminals of the third and fourth transistors N10 and N11 are connected (Box 370) to the ground reference voltage source. The drain terminal of the third transistor N10 is connected (Box 375) to an out-of-phase output NET1 of a differential input amplifier 10 of the comparator 5. The drain terminal of the fourth transistor N11 is connected (Box 380) to an in-phase output NET2 of the differential input amplifier of the comparator. The third and fourth transistors N10 and N11 are selectively activated (Box 215) for providing an offset to a threshold voltage of the differential amplifier 10 for the at least one fixed time period. The method detects (Box 220) when any decisions determining that second input INP is now lesser than or greater than the first input INN. Upon determining that second input INP is now lesser than or greater than the first input INN, any decisions causing the output(s) OUTN and OUTP of the comparator from changing state for at least one fixed time period are prevented (Box 225).

In various embodiments, the forming of the first, second, third, and fourth current sources I3, I4, I5, and I6 includes programming the first, second, third, and fourth current sources I3, I4, I5, and I6 to adjust the at least one fixed time period to eliminate unwanted changing of the state of the output of the comparator 5 when any decisions determining that second input INP is now lesser than or greater than the first input INN are detected too quickly. The step of programming the first, second, third, and fourth current sources I3, I4, I5, and I6 permits the setting of the hysteresis voltages of the threshold voltage of the input of the comparator 5.

In other embodiments, the step of forming the first and second capacitors C1 and C2 includes programming the capacitance value of the first and second capacitors C1 and C2 for adjusting the duration of the at least one fixed time period. For programming the first and second capacitors C1 and C2, the first and second capacitors C1 and C2 are formed of a plurality of switched capacitor circuits arranged in series and/or in parallel for adjusting the fixed time period.

Figure 6D:
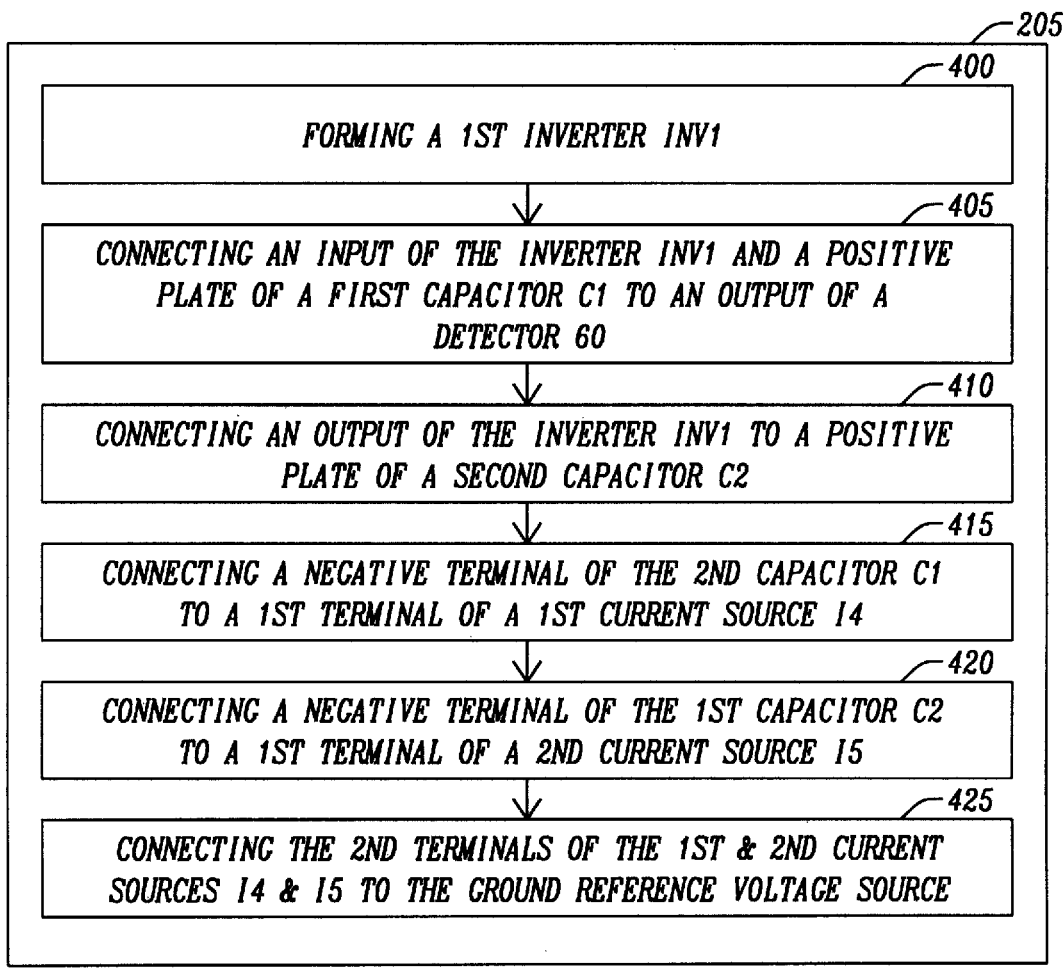

In FIG. 6d, the timer circuit 65 of the comparator 50 is formed (Box 205) by forming (Box 400) a first inverter INV1. The input of the inverter INV1 and a positive plate of a first capacitor C1 are connected (Box 405) to an output 64 of the detector 60. The output of the inverter INV1 is connected (Box 410) to a positive plate of a second capacitor C2. The negative terminal of the second capacitor C2 is connected (Box 415) to a first terminal of a first current source I4. The negative terminal of the first capacitor C1 is connected (Box 415) to a first terminal of a second current source I5. The second terminals of the first and second current sources I3 and I4 are connected (Box 420) the ground reference voltage source.

Figure 6E:
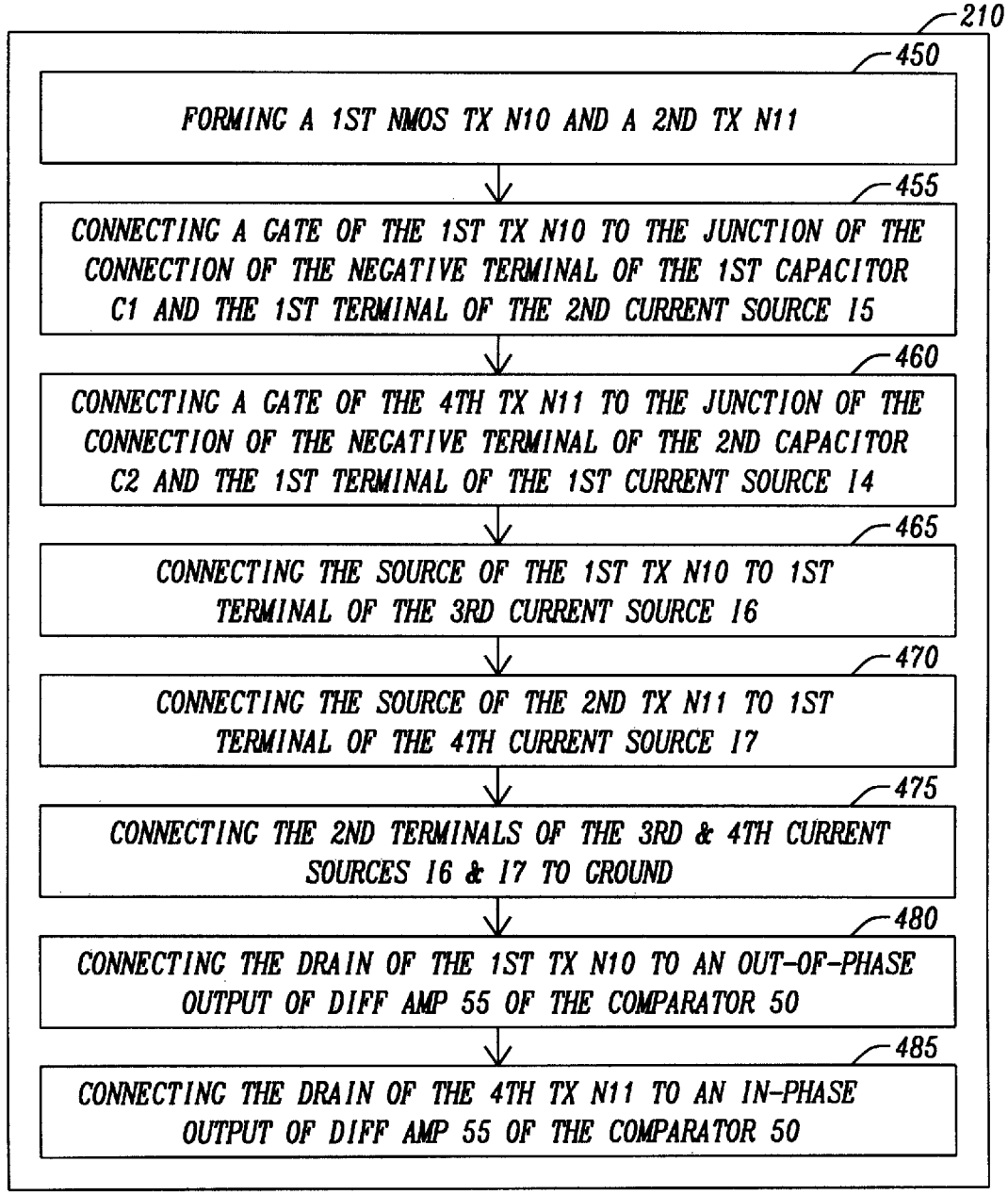

Referring to FIG. 6e, the hysteresis circuit 70 of the comparator 50 is formed (Box 210) by forming (Box 450) a first transistor N10 and a second transistor N11 of the first conductivity type. The first transistor N10 has a gate terminal connected (Box 455) to the junction of the connection of the negative plate of the first capacitor C1 and the first terminal of the second current source I5. The second transistor N11 has a gate terminal connected (Box 460) to the junction of the connection of the negative plate of the second capacitor C2 and the first terminal of the first current source I4. The source terminal of the first transistor N10 is connected (Box 465) to a first terminal of the third current source I6. The source terminal of the second transistor N11 is connected (Box 470) to a first terminal of the fourth current source I7. The second terminals of the third current source I5 and the fourth current source I6 are connected (Box 475) to the ground reference voltage source. The drain terminal of the first transistor N10 is connected (Box 480) to an out-of-phase output ARM1 of a differential input amplifier 55 of the comparator 50. The drain terminal of the second transistor N11 is connected (Box 485) to an in-phase output ARM2 of the differential input amplifier 55 of the comparator 50.

As shown in FIG. 6a, the third and second transistors N10 and N11 are selectively activated (Box 215) for providing an offset to a threshold voltage of the differential amplifier 55 for the at least one fixed time period. The method detects (Box 220) when any decisions determining that second input INP is now lesser than or greater than the first input INN. Upon determining that second input INP is now lesser than or greater than the first input INN, any decisions causing the output(s) OUTN and OUTP of the comparator from changing state for at least one fixed time period are prevented (Box 225).

In various embodiments, the forming of the first, second, third, and fourth current sources I4, I5, I6, and I7 includes programming the first, second, third, and fourth current sources I4, I5, I6, and I7 to adjust the at least one fixed time period to eliminate unwanted changing of the state of the output of the comparator 5 when any decisions determining that second input INP is now lesser than or greater than the first input INN are detected too quickly. The step of programming the first, second, third, and fourth current sources I4, I5, I6, and I7 permits the setting of the hysteresis voltages of the threshold voltage of the input of the comparator 50.

In other embodiments, the step of forming the first and second capacitors C1 and C2 includes programming the capacitance value of the first and second capacitors C1 and C2 for adjusting the duration of the at least one fixed time period. For programming the first and second capacitors C1 and C2, the first and second capacitors C1 and C2 are formed of a plurality of switched capacitor circuits arranged in series and/or in parallel for adjusting the fixed time period.

While this disclosure has been particularly shown and described with reference to the preferred embodiments thereof, it will be understood by those skilled in the art that various changes in form and details may be made without departing from the spirit and scope of the disclosure. For instance, the input transistors N1 and N2 of the differential input 10 of FIGS. 2 and 55 of FIG. 3 may be implemented as PMOS transistors or bipolar junction transistors (BJT).

What is claimed is:

1. A dynamic hysteresis circuit connected to an output of a trigger circuit of a dynamic hysteresis comparator for detecting when a decision is made that a first input of the comparator is greater than or lesser than a second input of the comparator causing an output of the comparator to change state, and once the decision causing the change of state of the output is detected, any decisions determining that the second input is now lesser than or greater than the first input are prevented from causing the output of the comparator from changing state for at least one fixed time period for a first and a second input of the dynamic hysteresis circuit, the dynamic hysteresis circuit comprising:

a timer circuit configured to create at least one controlled time delay to control the dynamic hysteresis; and a hysteresis circuit configured to divert current from a differential input pair of transistors of the dynamic hysteresis comparator for introducing an offset such that when the offset supports the signal that caused the comparator to switch, then the dynamic hysteresis comparator is unlikely to switch back during the at least one controlled time delay that offset is applied.

2. The dynamic hysteresis circuit of claim 1 wherein the timer circuit comprises:

a first controlled delay time generator comprising:

a first transistor of a first conductivity type having a gate terminal connected to an in-phase output of the trigger circuit;

a first resistor connected between a drain terminal of the first transistor and a power supply voltage source;

a first current source having a first terminal connected to a source terminal of the first transistor;

a first capacitor having a positive plate connected to a junction of the source terminal of the first transistor and the first terminal of the first current source; and a third current source having a first terminal connected to a negative plate of the first capacitor;

wherein the first transistor, the first resistor, the first capacitor, the first current source, and the third current source provide the first fixed time period for controlling a first controlled time delay for the first input of the dynamic hysteresis comparator;

a second controlled delay time generator comprising:

a second transistor of the first connectivity type having a gate terminal connected to an out-of-phase output of the trigger circuit;

a second resistor connected between a drain terminal of the second transistor and the power supply voltage source;

a second current source having a first terminal connected to a source terminal of the second transistor;

a second capacitor having a positive plate connected to a junction of the source terminal of the second transistor and the first terminal of the second current source; and a fourth current source having a first terminal connected to a negative plate of the second capacitor;

wherein the second transistor, the second resistor, the second capacitor, the second current source, and the fourth current source provide the second fixed time period for controlling a second controlled time delay for the second input of the dynamic hysteresis comparator.

3. The dynamic hysteresis circuit of claim 2 wherein the hysteresis circuit comprises:

a third transistor of the first conductivity type comprising:

a gate terminal connected to the junction of the connection of the negative plate of the first capacitor and the first terminal of the fourth current source of the first controlled delay time generator, a drain terminal connected to an out-of-phase output of a differential input amplifier of the comparator; and a source terminal connected to the ground reference voltage source;

a fourth transistor of the first conductivity type comprising:

a gate terminal connected to the junction of the connection of the negative plate of the second capacitor and the first terminal of the third current source of the second controlled delay time generator, drain terminal connected to an in-phase output of the differential input amplifier of the comparator, and a source terminal connected to the ground reference voltage source;

wherein the third transistor when activated provides an offset to a threshold voltage of the differential input amplifier for the first fixed time period to prevent the output terminals of the comparator from switching for the first controlled delay time when any decisions determining that second input is now lesser than or greater than the first input are detected;

wherein the fourth transistor when activated provides an offset to a threshold voltage of the differential input amplifier for the second fixed time period to prevent the output terminals of the comparator from switching for the second controlled delay time when any decisions determining that second input is now lesser than or greater than the first input are detected.

4. The dynamic hysteresis circuit of claim 1 wherein the timer circuit comprises:

an inverter having a first terminal connected to an output of the dynamic hysteresis comparator for inverting an output state present at the output of the dynamic hysteresis comparator;

a first controlled delay time generator comprising:

a third capacitor having a positive plate connected to the output of the dynamic hysteresis comparator, and a fifth current source having a first terminal connected to a negative terminal of the third capacitor; and wherein the third capacitor and the fifth current source provide the first fixed time period for controlling a first controlled time delay for the first input of the dynamic hysteresis comparator;

a second controlled delay time generator comprising:

a fourth capacitor having a positive plate connected to an output of the inverter, and a sixth current source having a first terminal connected to a negative terminal of the fourth capacitor;

wherein the fourth capacitor and the sixth current source provide the second fixed time period for controlling a second controlled time delay for the second input of the dynamic hysteresis comparator.

5. The dynamic hysteresis circuit of claim 4 wherein the hysteresis circuit comprises:

a fifth transistor of the first conductivity type comprising:

a gate terminal connected to the junction of the connection of the negative plate of the third capacitor and the first terminal of the fifth current source of the third delay of the third controlled delay time generator, and a drain terminal connected to an out-of-phase output of a differential input amplifier of the comparator;

a sixth transistor of the first conductivity type comprising:

a gate terminal connected to the junction of the connection of the negative plate of the fourth capacitor and the first terminal of the sixth current source of the fourth controlled delay time generator, drain terminal connected to an in-phase output of the differential input amplifier of the comparator, a seventh current source having a first terminal connected to a source of the fifth transistor and a second terminal connected to the ground reference voltage source, and an eighth current source having a first terminal connected to a source of the sixth transistor and a second terminal connected to the ground reference voltage source;

wherein the fifth transistor when activated provides an offset to a threshold voltage of the differential input amplifier for the first fixed time period to prevent the output terminals of the comparator from switching for the third controlled delay time when any decisions determining that second input is now lesser than or greater than the first input are detected;

wherein the sixth transistor when activated provides an offset to a threshold voltage of the differential input amplifier for the second fixed time period to prevent the output terminals of the comparator from switching for the fourth controlled delay time when any decisions determining that second input is now lesser than or greater than the first input are detected.

6. The dynamic hysteresis circuit of claim 2 wherein the first, second, third, and fourth current sources are programmable to adjust the fixed time period to eliminate unwanted changing of the state of the output of the comparator when any decisions determining that second input is now lesser than or greater than the first input are detected too quickly, wherein the ability to program the first, second, third, and fourth current sources permits the setting of the hysteresis voltages of the threshold voltage of the input of the comparator.

7. The dynamic hysteresis circuit of claim 2 wherein the capacitance value of the first and second capacitors is programmable for adjusting the duration of the first and second fixed time period.

8. The dynamic hysteresis circuit of claim 7 wherein the first and second capacitors include a plurality of switched capacitor circuits arranged in series and/or in parallel for adjusting the fixed time period.

9. The dynamic hysteresis circuit of claim 5 wherein the fifth, sixth, seventh and eighth current sources are programmable to adjust the fixed time period to eliminate unwanted changing of the state of the output of the comparator when any decisions determining that second input is now lesser than or greater than the first input are detected too quickly, wherein the ability to program the first, second, third, and fourth current sources permits the setting of the hysteresis voltages of the threshold voltage of the input of the comparator.

10. The dynamic hysteresis circuit of claim 5 wherein the capacitance value of the third and fourth capacitors is programmable for adjusting the duration of the first and second fixed time period.

11. The dynamic hysteresis circuit of claim 10 wherein the third and fourth capacitors include a plurality of switched capacitor circuits arranged in series and/or in parallel for adjusting the fixed time period.

12. A dynamic hysteresis comparator having a threshold voltage level with dynamic hysteresis for sensing small changes in differential input signals at a pair of inputs, while controlling a duration state for at least one fixed time period that an output voltage state will remain fixed for preventing the output of the comparator from changing state in an unstable fashion or "chattering", the dynamic hysteresis comparator comprising:

a dynamic hysteresis circuit connected to an output of a trigger circuit of the dynamic hysteresis comparator configured to detect when a decision is made that a first input of the comparator is greater than or lesser than a second input of the comparator causing an output of the comparator to change state, and once the decision causing the change of state of the output is detected, any decisions determining that the second input is now lesser than or greater than the first input are prevented from causing the output of the comparator from changing state for a fixed time period, the dynamic hysteresis circuit comprising:

a timer circuit configured to create at least one controlled time delay to control the dynamic hysteresis; and a hysteresis circuit configured to divert current from a differential input pair of transistors of the dynamic hysteresis comparator for introducing an offset such that when the offset supports the signal that caused the comparator to switch, then the dynamic hysteresis comparator is unlikely to switch back during the at least one controlled time delay that offset is applied.

13. The dynamic hysteresis comparator of claim 12 wherein the timer circuit comprises:

a first transistor of a first conductivity type having a gate terminal connected to an in-phase output of the trigger circuit;

a second transistor of the first connectivity type having a gate terminal connected to an out-of-phase output of the trigger circuit;

a first resistor connected between a drain terminal of the first transistor and a power supply voltage source;

a second resistor connected between a drain terminal of the second transistor and the power supply voltage source;

a first current source having a first terminal connected to a source terminal of the first transistor;

a second current source having a first terminal connected to a source terminal of the second transistor;

a first capacitor having a positive plate connected to a junction of the source terminal of the first transistor and the first terminal of the first current source;

a second capacitor having a positive plate connected to a junction of the source terminal of the second transistor and the first terminal of the second current source;

a third current source having a first terminal connected to a negative plate of the first capacitor; and a fourth current source having a first terminal connected to a negative plate of the second capacitor;

wherein the first transistor, the first resistor, the first capacitor, the first current source, and the third current source provide the first fixed time period for the first input of the dynamic hysteresis comparator;

wherein the second transistor, the second resistor, the second capacitor, the second current source, and the fourth current source provide the second fixed time period for the second input of the dynamic hysteresis comparator; and wherein second terminals of the first, second, third and fourth current sources are connected the ground reference voltage source.

14. The dynamic hysteresis comparator of claim 13 wherein the hysteresis circuit comprises:

a third transistor of the first conductivity type comprising:
a gate terminal connected to the junction of the connection of the negative plate of the first capacitor and the first terminal of the fourth current source of the first controlled delay time generator, a drain terminal connected to an out-of-phase output of a differential input amplifier of the comparator; and
a source terminal connected to the ground reference voltage source;
a fourth transistor of the first conductivity type comprising:
a gate terminal connected to the junction of the connection of the negative plate of the second capacitor and the first terminal of the third current source of the second controlled delay time generator,
drain terminal connected to an in-phase output of the differential input amplifier of the comparator, and
a source terminal connected to the ground reference voltage source;
wherein the third transistor when activated provides an offset to a threshold voltage of the differential input amplifier for the first fixed time period to prevent the output terminals of the comparator from switching for the first controlled delay time when any decisions determining that second input is now lesser than or greater than the first input are detected;
wherein the fourth transistor when activated provides an offset to a threshold voltage of the differential input amplifier for the second fixed time period to prevent the output terminals of the comparator from switching for the second controlled delay time when any decisions determining that second input is now lesser than or greater than the first input are detected.

15. The dynamic hysteresis comparator of claim 12 wherein the timer circuit comprises:
an inverter having a first terminal connected to an output of the dynamic hysteresis comparator for inverting an output state present at the output of the dynamic hysteresis comparator;
a first controlled delay time generator comprising:
a third capacitor having a positive plate connected to the output of the dynamic hysteresis comparator, and
a fifth current source having a first terminal connected to a negative terminal of the third capacitor; and
wherein the third capacitor and the fifth current source provide the first fixed time period for controlling a first controlled time delay for the first input of the dynamic hysteresis comparator;
a second controlled delay time generator comprising:
a fourth capacitor having a positive plate connected to an output of the inverter, and
a sixth current source having a first terminal connected to a negative terminal of the fourth capacitor;
wherein the fourth capacitor and the sixth current source provide the second fixed time period for controlling a second controlled time delay for the second input of the dynamic hysteresis comparator.

16. The dynamic hysteresis comparator of claim 15 wherein the hysteresis circuit comprises:
a fifth transistor of the first conductivity type comprising:
a gate terminal connected to the junction of the connection of the negative plate of the third capacitor and the first terminal of the fifth current source of the third delay of the third controlled delay time generator, and
a drain terminal connected to an out-of-phase output of a differential input amplifier of the comparator;
a sixth transistor of the first conductivity type comprising:
a gate terminal connected to the junction of the connection of the negative plate of the fourth capacitor and the first terminal of the sixth current source of the fourth controlled delay time generator, and
drain terminal connected to an in-phase output of the differential input amplifier of the comparator, a seventh current source having a first terminal connected to a source of the fifth transistor and a second terminal connected to the ground reference voltage source; and
an eighth current source having a first terminal connected to a source of the sixth transistor and a second terminal connected to the ground reference voltage source;
wherein the fifth transistor when activated provides an offset to a threshold voltage of the differential input amplifier for the first fixed time period to prevent the output terminals of the comparator from switching for the third controlled delay time when any decisions determining that second input is now lesser than or greater than the first input are detected;
wherein the sixth transistor when activated provides an offset to a threshold voltage of the differential input amplifier for the second fixed time period to prevent the output terminals of the comparator from switching for the fourth controlled delay time when any decisions determining that second input is now lesser than or greater than the first input are detected.

17. The dynamic hysteresis comparator of claim 14 wherein the first, second, third, and fourth current sources are programmable to adjust the fixed time period to eliminate unwanted changing of the state of the output of the comparator when any decisions determining that second input is now lesser than or greater than the first input are detected too quickly, wherein the ability to program the first, second, third, and fourth current sources permits the setting of the hysteresis voltages of the threshold voltage of the input of the comparator.

18. The dynamic hysteresis comparator of claim 14 wherein the capacitance value of the first and second capacitors is programmable for adjusting the duration of the fixed time period.

19. The dynamic hysteresis comparator of claim 18 wherein the first and second capacitors include a plurality of switched capacitor circuits arranged in series and/or in parallel for adjusting the fixed time period.

20. The dynamic hysteresis comparator of claim 15 wherein the fifth, sixth, seventh and eighth current sources are programmable to adjust the fixed time period to eliminate unwanted changing of the state of the output of the comparator when any decisions determining that second input is now lesser than or greater than the first input are detected too quickly, wherein the ability to program the first, second, third, and fourth current sources permits the setting of the hysteresis voltages of the threshold voltage of the input of the comparator.

21. The dynamic hysteresis comparator of claim 15 wherein the capacitance value of the third and fourth capacitors is programmable for adjusting the duration of the first and second fixed time period.

22. The dynamic hysteresis comparator of claim 21 wherein the third and fourth capacitors include a plurality of switched capacitor circuits arranged in series and/or in parallel for adjusting the fixed time period.

23. An electronic apparatus comprising a mode switch detection circuit for controlling the transition between a continuous operation mode and a quiescent operation mode to prevent instability in the output of the electronic apparatus, the mode switch detection circuit comprising:
a dynamic hysteresis comparator having a threshold voltage level with dynamic hysteresis for sensing small changes in differential input signals at a pair of inputs, while controlling a duration state for at least one fixed time period that an output voltage state will remain fixed for preventing the output of the comparator from changing state in an unstable fashion or "chattering", the dynamic hysteresis comparator comprising:
a dynamic hysteresis circuit connected to an output of a trigger circuit of the dynamic hysteresis comparator configured to detect when a decision is made that a first input of the comparator is greater than or lesser than a second input of the comparator causing an output of the comparator to change state, and once the decision causing the change of state of the output is detected, any decisions determining that the second input is now lesser than or greater than the first input are prevented from causing the output of the comparator from changing state for a fixed time period, the dynamic hysteresis circuit comprising:
a timer circuit configured to create at least one controlled time delay to control the dynamic hysteresis; and
a hysteresis circuit configured to divert current from a differential input pair of transistors of the dynamic hysteresis comparator for introducing an offset such that when the offset supports the signal that caused the comparator to switch, then the dynamic hysteresis comparator is unlikely to switch back during the at least one controlled time delay that offset is applied.

24. The electronic apparatus of claim 23 wherein the timer circuit comprises:
a first transistor of a first conductivity type having a gate terminal connected to an in-phase output of the trigger circuit;
a second transistor of the first connectivity type having a gate terminal connected to an out-of-phase output of the trigger circuit;
a first resistor connected between a drain terminal of the first transistor and a power supply voltage source;
a second resistor connected between a drain terminal of the second transistor and the power supply voltage source;
a first current source having a first terminal connected to a source terminal of the first transistor;
a second current source having a first terminal connected to a source terminal of the second transistor;
a first capacitor having a positive plate connected to a junction of the source terminal of the first transistor and the first terminal of the first current source;
a second capacitor having a positive plate connected to a junction of the source terminal of the second transistor and the first terminal of the second current source;
a third current source having a first terminal connected to a negative plate of the first capacitor; and
a fourth current source having a first terminal connected to a negative plate of the second capacitor;
wherein the first transistor, the first resistor, the first capacitor, the first current source, and the third current source provide the first fixed time period for the first input of the dynamic hysteresis comparator;
wherein the second transistor, the second resistor, the second capacitor, the second current source, and the fourth current source provide the second fixed time period for the second input of the dynamic hysteresis comparator; and
wherein second terminals of the first, second, third and fourth current sources are connected the ground reference voltage source.

25. The electronic apparatus of claim 23 wherein the hysteresis circuit comprises:

a third transistor of the first conductivity type comprising:
a gate terminal connected to the junction of the connection of the negative plate of the first capacitor and the first terminal of the fourth current source of the first controlled delay time generator,
a drain terminal connected to an out-of-phase output of a differential input amplifier of the comparator, and
a source terminal connected to the ground reference voltage source;
a fourth transistor of the first conductivity type comprising:
a gate terminal connected to the junction of the connection of the negative plate of the second capacitor and the first terminal of the third current source of the second controlled delay time generator,
drain terminal connected to an in-phase output of the differential input amplifier of the comparator, and
a source terminal connected to the ground reference voltage source;
wherein the third transistor when activated provides an offset to a threshold voltage of the differential input amplifier for the first fixed time period to prevent the output terminals of the comparator from switching for the first controlled delay time when any decisions determining that second input is now lesser than or greater than the first input are detected;
wherein the fourth transistor when activated provides an offset to a threshold voltage of the differential input amplifier for the second fixed time period to prevent the output terminals of the comparator from switching for the second controlled delay time when any decisions determining that second input is now lesser than or greater than the first input are detected.

26. The electronic apparatus of claim 24 wherein the hysteresis circuit comprises:
an inverter having a first terminal connected to an output of the dynamic hysteresis comparator for inverting an output state present at the output of the dynamic hysteresis comparator;
a first controlled delay time generator comprising:
a third capacitor having a positive plate connected to the output of the dynamic hysteresis comparator, and
a fifth current source having a first terminal connected to a negative terminal of the third capacitor; and
wherein the third capacitor and the fifth current source provide the first fixed time period for controlling a first controlled time delay for the first input of the dynamic hysteresis comparator;
a second controlled delay time generator comprising:
a fourth capacitor having a positive plate connected to an output of the inverter, and
a sixth current source having a first terminal connected to a negative terminal of the fourth capacitor;
wherein the fourth capacitor and the sixth current source provide the second fixed time period for controlling a second controlled time delay for the second input of the dynamic hysteresis comparator.

27. The electronic apparatus of claim 26 wherein the hysteresis circuit comprises:
a fifth transistor of the first conductivity type comprising:
a gate terminal connected to the junction of the connection of the negative plate of the third capacitor and the first terminal of the fifth current source of the third delay of the third controlled delay time generator, and
a drain terminal connected to an out-of-phase output of a differential input amplifier of the comparator, a sixth transistor of the first conductivity type comprising:
a gate terminal connected to the junction of the connection of the negative plate of the fourth capacitor and the first terminal of the sixth current source of the fourth controlled delay time generator, and
drain terminal connected to an in-phase output of the differential input amplifier of the comparator;
a seventh current source having a first terminal connected to a source of the fifth transistor and a second terminal connected to the ground reference voltage source; and
an eighth current source having a first terminal connected to a source of the sixth transistor and a second terminal connected to the ground reference voltage source;
wherein the fifth transistor when activated provides an offset to a threshold voltage of the differential input amplifier for the first fixed time period to prevent the output terminals of the comparator from switching for the third controlled delay time when any decisions determining that second input is now lesser than or greater than the first input are detected;
wherein the sixth transistor when activated provides an offset to a threshold voltage of the differential input amplifier for the second fixed time period to prevent the output terminals of the comparator from switching for the fourth controlled delay time when any decisions determining that second input is now lesser than or greater than the first input are detected.

28. The electronic apparatus of claim 24 wherein the first, second, third, and fourth current sources are programmable to adjust the fixed time period to eliminate unwanted changing of the state of the output of the comparator when any decisions determining that second input is now lesser than or greater than the first input are detected too quickly, wherein the ability to program the first, second, third, and fourth current sources permits the setting of the hysteresis voltages of the threshold voltage of the input of the comparator.

29. The electronic apparatus of claim 24 wherein the capacitance value of the first and second capacitors is programmable for adjusting the duration of the fixed time period.

30. The electronic apparatus of claim 29 wherein the first and second capacitors include a plurality of switched capacitor circuits arranged in series and/or in parallel for adjusting the fixed time period.

31. The electronic apparatus of claim 27 wherein the fifth, sixth, seventh and eighth current sources are programmable to adjust the fixed time period to eliminate unwanted changing of the state of the output of the comparator when any decisions determining that second input is now lesser than or greater than the first input are detected too quickly, wherein the ability to program the first, second, third, and fourth current sources permits the setting of the hysteresis voltages of the threshold voltage of the input of the comparator.

32. The electronic apparatus of claim 27 wherein the capacitance value of the third and fourth capacitors is programmable for adjusting the duration of the first and second fixed time period.

33. The electronic apparatus of claim 32 wherein the third and fourth capacitors include a plurality of switched capacitor circuits arranged in series and/or in parallel for adjusting the fixed time period.

34. A buck DC-to-DC converter comprising a mode switch detection circuit for controlling the transition between a continuous or synchronous mode and a sleep or discontinuous mode to prevent instability in the output of the buck DC-to-DC converter, the mode switch detection circuit comprising:
a dynamic hysteresis comparator having a threshold voltage level with dynamic hysteresis for sensing small changes in differential input signals at a pair of inputs, while controlling a duration state for at least one fixed time period that an output voltage state will remain fixed for preventing the output of the comparator from changing state in an unstable fashion or "chattering", the dynamic hysteresis comparator comprising:
a dynamic hysteresis circuit connected to an output of a trigger circuit of the dynamic hysteresis comparator configured to detect when a decision is made that a first input of the comparator is greater than or lesser than a second input of the comparator causing an output of the comparator to change state, and once the decision causing the change of state of the output is detected, any decisions determining that the second input is now lesser than or greater than the first input are prevented from causing the output of the comparator from changing state for a fixed time period, the dynamic hysteresis circuit comprising:
a timer circuit configure to create at least one controlled time delay to control the dynamic hysteresis; and
a hysteresis circuit configured to divert current from a differential input pair of transistors of the dynamic hysteresis comparator for introducing an offset such that when the offset supports the signal that caused the comparator to switch, then the dynamic hysteresis comparator is unlikely to switch back during the at least one controlled time delay that offset is applied.

35. The buck DC-to-DC converter of claim 34 wherein the timer circuit comprises:
a first controlled delay time generator comprising:
a first transistor of a first conductivity type having a gate terminal connected to an in-phase output of the trigger circuit,
a first resistor connected between a drain terminal of the first transistor and a power supply voltage source,
a first current source having a first terminal connected to a source terminal of the first transistor,
a first capacitor having a positive plate connected to a junction of the source terminal of the first transistor and the first terminal of the first current source; and
a third current source having a first terminal connected to a negative plate of the first capacitor;
wherein the first transistor, the first resistor, the first capacitor, the first current source, and the third current source provide the first fixed time period for controlling a first controlled time delay for the first input of the dynamic hysteresis comparator; and
a second controlled delay time generator comprising:
a second transistor of the first connectivity type having a gate terminal connected to an out-of-phase output of the trigger circuit,
a second resistor connected between a drain terminal of the second transistor and the power supply voltage source,
a second current source having a first terminal connected to a source terminal of the second transistor,
a second capacitor having a positive plate connected to a junction of the source terminal of the second transistor and the first terminal of the second current source, and
a fourth current source having a first terminal connected to a negative plate of the second capacitor;
wherein the second transistor, the second resistor, the second capacitor, the second current source, and the fourth current source provide the second fixed time period for controlling a second controlled time delay for the second input of the dynamic hysteresis comparator.

36. The buck DC-to-DC converter of claim 35 wherein the hysteresis circuit comprises:
a third transistor of the first conductivity type comprising:
a gate terminal connected to the junction of the connection of the negative plate of the first capacitor and the first terminal of the fourth current source of the first controlled delay time generator,
a drain terminal connected to an out-of-phase output of a differential input amplifier of the comparator; and
a source terminal connected to the ground reference voltage source; and
a fourth transistor of the first conductivity type comprising:
a gate terminal connected to the junction of the connection of the negative plate of the second capacitor and the first terminal of the third current source of the second controlled delay time generator,
drain terminal connected to an in-phase output of the differential input amplifier of the comparator, and
a source terminal connected to the ground reference voltage source;
wherein the third transistor when activated provides an offset to a threshold voltage of the differential input amplifier for the first fixed time period to prevent the output terminals of the comparator from switching for the first controlled delay time when any decisions determining that second input is now lesser than or greater than the first input are detected;
wherein the fourth transistor when activated provides an offset to a threshold voltage of the differential input amplifier for the second fixed time period to prevent the output terminals of the comparator from switching for the second controlled delay time when any decisions determining that second input is now lesser than or greater than the first input are detected.

37. The buck DC-to-DC converter of claim 34 wherein the timer circuit comprises:
an inverter having a first terminal connected to an output of the dynamic hysteresis comparator for inverting an output state present at the output of the dynamic hysteresis comparator;
a first controlled delay time generator comprising:
a third capacitor having a positive plate connected to the output of the dynamic hysteresis comparator, and
a fifth current source having a first terminal connected to a negative terminal of the third capacitor; and
wherein the third capacitor and the fifth current source provide the first fixed time period for controlling a first controlled time delay for the first input of the dynamic hysteresis comparator;
a second controlled delay time generator comprising:
a fourth capacitor having a positive plate connected to an output of the inverter, and
a sixth current source having a first terminal connected to a negative terminal of the fourth capacitor;
wherein the fourth capacitor and the sixth current source provide the second fixed time period for controlling a second controlled time delay for the second input of the dynamic hysteresis comparator.

38. The buck DC-to-DC converter of claim 37 wherein the hysteresis circuit comprises:
a fifth transistor of the first conductivity type comprising:
a gate terminal connected to the junction of the connection of the negative plate of the third capacitor and the first terminal of the fifth current source of the third delay of the third controlled delay time generator, and
a drain terminal connected to an out-of-phase output of a differential input amplifier of the comparator;
a sixth transistor of the first conductivity type comprising:
a gate terminal connected to the junction of the connection of the negative plate of the fourth capacitor and the first terminal of the sixth current source of the fourth controlled delay time generator, and
drain terminal connected to an in-phase output of the differential input amplifier of the comparator,
a seventh current source having a first terminal connected to a source of the fifth transistor and a second terminal connected to the ground reference voltage source; and
an eighth current source having a first terminal connected to a source of the sixth transistor and a second terminal connected to the ground reference voltage source;
wherein the fifth transistor when activated provides an offset to a threshold voltage of the differential input amplifier for the first fixed time period to prevent the output terminals of the comparator from switching for the third controlled delay time when any decisions determining that second input is now lesser than or greater than the first input are detected;
wherein the sixth transistor when activated provides an offset to a threshold voltage of the differential input amplifier for the second fixed time period to prevent the output terminals of the comparator from switching for the fourth controlled delay time when any decisions determining that second input is now lesser than or greater than the first input are detected.

39. The buck DC-to-DC converter of claim 35 wherein the first, second, third, and fourth current sources are programmable to adjust the fixed time period to eliminate unwanted changing of the state of the output of the comparator when any decisions determining that second input is now lesser than or greater than the first input are detected too quickly, wherein the ability to program the first, second, third, and fourth current sources permits the setting of the hysteresis voltages of the threshold voltage of the input of the comparator.

40. The buck DC-to-DC converter of claim 35 wherein the capacitance value of the first and second capacitors is programmable for adjusting the duration of the fixed time period.

41. The buck DC-to-DC converter of claim 40 wherein the first and second capacitors include a plurality of switched capacitor circuits arranged in series and/or in parallel for adjusting the fixed time period.

42. The buck DC-to-DC converter of claim 38 wherein the fifth, sixth, seventh and eighth current sources are programmable to adjust the fixed time period to eliminate unwanted changing of the state of the output of the comparator when any decisions determining that second input is now lesser than or greater than the first input are detected too quickly, wherein the ability to program the first, second, third, and fourth current sources permits the setting of the hysteresis voltages of the threshold voltage of the input of the comparator.

43. The buck DC-to-DC converter of claim 38 wherein the capacitance value of the third and fourth capacitors is programmable for adjusting the duration of the first and second fixed time period.

44. The buck DC-to-DC converter of claim 43 wherein the third and fourth capacitors include a plurality of switched capacitor circuits arranged in series and/or in parallel for adjusting the fixed time period.

45. A method for forming a comparator that has dynamic hysteresis comprises the steps of:
   forming a dynamic hysteresis circuit;
   connecting the dynamic hysteresis circuit to an output of a trigger circuit of the comparator;
   detecting when a decision is made that a first input of the comparator is greater than or lesser than a second input of the comparator causing an output of the comparator to change state; and
   preventing any decisions determining that second input is now lesser than or greater than the first input from causing the output of the comparator from changing state during at least one controlled time delay, once the decision causing the change of state of the output is detected.

46. The method for forming a dynamic hysteresis comparator of claim 45 wherein the step of forming the dynamic hysteresis circuit comprises the steps of:
   forming a timer circuit configured to create at least one fixed time period controlled delay to control the dynamic hysteresis; and
   forming a hysteresis circuit configured to divert current from a differential input pair of transistors of the dynamic hysteresis comparator for introducing an offset such that when the offset supports the signal that caused the comparator to switch, then the dynamic hysteresis comparator is unlikely to switch back during the at least one controlled time delay offset is applied.

47. The method for forming a dynamic hysteresis comparator of claim 46 wherein the step of forming timer circuit comprises the steps of:
   forming a first controlled delay time generator comprising the steps of:
      forming a first transistor of a first conductivity type having a gate terminal connected to an in-phase output of the trigger circuit,
      forming a first resistor connected between a drain terminal of the first transistor and a power supply voltage source,
      forming a first current source having a first terminal connected to a source terminal of the first transistor,
      forming a first capacitor having a positive plate connected to a junction of the source terminal of the first transistor and the first terminal of the first current source; and
      forming a third current source having a first terminal connected to a negative plate of the first capacitor;
   wherein the first transistor, the first resistor, the first capacitor, the first current source, and the third current source provide the first fixed time period for controlling a first controlled time delay for the first input of the dynamic hysteresis comparator;
   forming a second controlled delay time generator comprising:
      forming a second transistor of the first connectivity type having a gate terminal connected to an out-of-phase output of the trigger circuit,
      forming a second resistor connected between a drain terminal of the second transistor and the power supply voltage source,
      forming a second current source having a first terminal connected to a source terminal of the second transistor,
      forming a second capacitor having a positive plate connected to a junction of the source terminal of the second transistor and the first terminal of the second current source; and
      forming a fourth current source having a first terminal connected to a negative plate of the second capacitor;
   wherein the second transistor, the second resistor, the second capacitor, the second current source, and the fourth current source provide the second fixed time period for controlling a second controlled time delay for the second input of the dynamic hysteresis comparator.

48. The method for forming a dynamic hysteresis comparator of claim 47 wherein the step of forming the hysteresis circuit comprises the steps of:
   forming a third transistor of the first conductivity type;
   connecting a gate terminal third transistor to the junction of the connection of the negative plate of the first capacitor and the first terminal of the fourth current source of the first controlled delay time generator;
   connecting a source terminal of the third transistors to the ground reference voltage source;
   connecting a drain terminal of the third transistor to an out-of-phase output of a differential input amplifier of the comparator;
   forming a fourth transistor of the first conductivity type;
   connecting a gate terminal fourth transistor to the junction of the connection of the negative plate of the second capacitor and the first terminal of the third current source of the second controlled delay time generator;
   connecting a source terminal of the fourth transistor to the ground reference voltage source;
   connecting a drain terminal of the fourth transistor to an in-phase output of the differential input amplifier of the comparator;
   selectively activating the third and fourth transistors for providing an offset to a threshold voltage of the differential amplifier for the fixed time period;
   determining when any decisions that second input is now lesser than or greater than the first input;
   wherein during operation, activating the third transistor for providing an offset to a threshold voltage of the differential input amplifier for the first fixed time period for preventing the output terminals of the comparator from switching for the first controlled time delay when any decisions determining that second input is now lesser than or greater than the first input are detected;
   wherein during operation, activating the fourth transistor for providing an offset to a threshold voltage of the differential input amplifier for the second fixed time period for preventing the output terminals of the comparator from switching for the second controlled time delay when any decisions determining that second input is now lesser than or greater than the first input are detected.

49. The method for forming a dynamic hysteresis comparator of claim 46 wherein the step of forming timer circuit comprises the steps of:
   forming an inverter having a first terminal connected to an output of the dynamic hysteresis comparator for inverting an output state present at the output of the dynamic hysteresis comparator;
   forming a third capacitor having a positive plate connected to the output of the dynamic hysteresis comparator;
   forming a fourth capacitor having a positive plate connected to an output of the inverter;
   forming a fifth current source having a first terminal connected to a negative terminal of the third capacitor;
   forming a sixth current source having a first terminal connected to a negative terminal of the fourth capacitor;

wherein during operation, the third capacitor and the fifth current source provide the third controlled time delay for the first input of the dynamic hysteresis comparator;

wherein during operation, the fourth capacitor and the sixth current source provide the fourth controlled time delay for the second input of the dynamic hysteresis comparator; and connecting second terminals of the fifth and sixth current sources are connected the ground reference voltage source.

50. The method for forming a dynamic hysteresis comparator of claim 49 wherein the step of forming timer circuit comprises the steps of:
- forming a fifth transistor of the first conductivity type comprising the steps of:
  - forming a gate terminal connected to the junction of the connection of the negative plate of the third capacitor and the first terminal of the fifth current source of the third controlled delay time generator, and
  - forming a drain terminal connected to an out-of-phase output of a differential input amplifier of the comparator;
- forming a sixth transistor of the first conductivity type comprising the steps of:
  - forming a gate terminal connected to the junction of the connection of the negative plate of the fourth capacitor and the first terminal of the sixth current source of the fourth controlled delay time generator, and
  - forming drain terminal connected to an in-phase output of the differential input amplifier of the comparator;
- forming a seventh current source having a first terminal connected to a source of the fifth transistor and a second terminal connected to the ground reference voltage source; and
- forming an eighth current source having a first terminal connected to a source of the sixth transistor and a second terminal connected to the ground reference voltage source;
- wherein in operation, activating the fifth transistor for providing an offset to a threshold voltage of the differential input amplifier for the third controlled delay time for preventing the output terminals of the comparator from switching when any decisions determining that second input is now lesser than or greater than the first input are detected;
- wherein in operation, activating the sixth transistor for providing an offset to a threshold voltage of the differential input amplifier for the fourth controlled delay time for preventing the output terminals of the comparator from switching when any decisions determining that second input is now lesser than or greater than the first input are detected.

51. The method for forming a dynamic hysteresis comparator of claim 47 wherein the steps of forming first, second, third, and fourth current sources further comprises forming the first, second, third, and fourth current sources to be adjustable such that the at least one controlled delay time is programmable to eliminate unwanted changing of the state of the output of the comparator when any decisions determining that second input is now lesser than or greater than the first input are detected too quickly, wherein the ability to program the first, second, third, and fourth current sources permits the setting of the hysteresis voltages of the threshold voltage of the input of the comparator.

52. The method for forming a dynamic hysteresis comparator of claim 47 wherein the steps of forming the first and second capacitors further comprises the step of forming the first and second capacitors to be variable such that the capacitance value of the first and second capacitors is programmable for adjusting the duration of the at least one controlled delay time.

53. The method for forming a dynamic hysteresis comparator of claim 52 wherein the steps of forming the first and second capacitors comprise the steps of forming a plurality of switched capacitor circuits arranged in series and/or in parallel for adjusting the fixed time period.

54. The method for forming a dynamic hysteresis comparator of claim 50 wherein the steps of forming the fifth, sixth, seventh and eighth current sources to be adjustable such that the at least one controlled delay time is programmable to eliminate unwanted changing of the state of the output of the comparator when any decisions determining that second input is now lesser than or greater than the first input are detected too quickly, wherein the ability to program the first, second, third, and fourth current sources permits the setting of the hysteresis voltages of the threshold voltage of the input of the comparator.

55. The method for forming a dynamic hysteresis comparator of claim 50 wherein the steps of forming the third and fourth capacitors further comprises the step of forming the third and forth capacitors to be variable such that the capacitance value of the first and second capacitors is programmable for adjusting the duration of the at least one controlled delay time.

56. The method for forming a dynamic hysteresis comparator of claim 55 wherein the steps of forming the third and fourth capacitors comprise the steps of forming a plurality of switched capacitor circuits arranged in series and/or in parallel for adjusting the fixed time period.

* * * * *